United States Patent [19]
Bell

[11] Patent Number: 6,119,463
[45] Date of Patent: Sep. 19, 2000

[54] THERMOELECTRIC HEAT EXCHANGER

[75] Inventor: Lon E. Bell, Pasadena, Calif.

[73] Assignee: Amerigon, Irwindale, Calif.

[21] Appl. No.: 09/076,518

[22] Filed: May 12, 1998

[51] Int. Cl.[7] .............................. F25B 21/02; F28F 5/00
[52] U.S. Cl. ............................ 62/3.7; 62/3.61; 62/259.3; 165/86
[58] Field of Search ................... 62/3.2, 3.3, 3.7, 62/3.6, 3.62, 3.61, 259.3; 165/86

[56] References Cited

U.S. PATENT DOCUMENTS

| | | | |
|---|---|---|---|
| 2,362,259 | 11/1944 | Findley | 171/125 |
| 2,363,168 | 11/1944 | Findley | 126/110 |
| 2,519,241 | 8/1950 | Findley | 126/116 |
| 2,984,077 | 5/1961 | Gaskill | 62/3.7 |
| 3,186,240 | 6/1965 | Daubert | 62/3.7 |
| 3,253,649 | 5/1966 | Laing | 165/86 |
| 3,599,437 | 8/1971 | Panas | 62/3.7 |
| 4,665,707 | 5/1987 | Hamilton | 62/3.2 |
| 4,823,554 | 4/1989 | Trachtenberg et al. | 62/3.62 |
| 4,988,847 | 1/1991 | Argos et al. | 392/363 |
| 5,111,664 | 5/1992 | Yang | 62/3.62 |
| 5,419,780 | 5/1995 | Suski | 136/205 |
| 5,524,439 | 6/1996 | Gallup et al. | 62/3.5 |
| 5,544,488 | 8/1996 | Reid | 62/3.7 |

FOREIGN PATENT DOCUMENTS

| | | | |
|---|---|---|---|
| 404165234 | 6/1992 | Japan | 62/3.7 |

*Primary Examiner*—William Doerrler
*Attorney, Agent, or Firm*—Knobbe, Martens, Olson & Bear, LLP.

[57] ABSTRACT

Disclosed is a system for thermally conditioning and pumping a fluid having use as a ventilation system for vehicle seats and other applications. The system includes a thermoelectric heat exchanger having a thermoelectric element configured to pump heat from one body to another body. A pair of heat exchanger elements comprising rotor units are coupled to the thermoelectric element for both transferring heat to and from the thermoelectric element and generating a fluid flow across the thermoelectric element. The conditioned fluid may be placed in thermal communication with a variety of objects, one of which is a vehicle seat to provide localized heating and cooling of a person sitting on the seat.

60 Claims, 11 Drawing Sheets

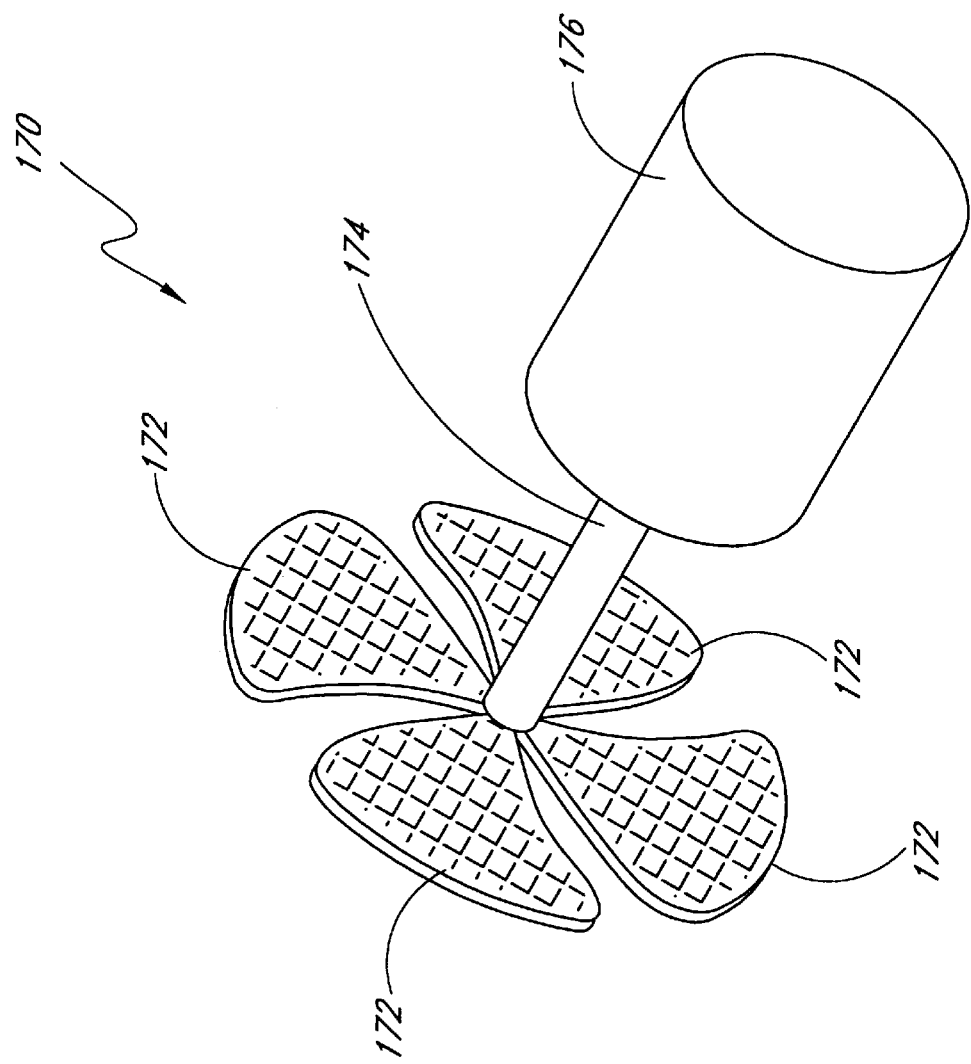

THERMOELECTRIC HEAT EXCHANGER

BACKGROUND OF THE INVENTION

1. Field of the Invention

The present invention relates to temperature control devices. More particularly, the present invention relates to a thermoelectric heat exchanger that is particularly useful for controlling the temperature of a seat, such as an automobile seat.

2. Description of the Related Art

Modern automobile seats may be equipped with temperature control systems that allow the occupant to vary the temperature of the seat by flowing temperature-controlled air through the seat covering. One type of system comprises a seat having a heat transfer system mounted therein, such as a thermoelectric element configured to heat or cool air that is moved over the element using a separate fan unit that is also mounted within the seat. The conditioned air is distributed to the occupant by passing the air through the seat surface via a series of air ducts within the seat.

The amount of space available within, below and around the seat for such temperature control systems is severely limited. In some cars, to save weight or increase passenger room, the seats are a few inches thick and abut the adjacent structure of the car, such as the floorboard or the back of the car. Further, automobile manufacturers are increasingly mounting various devices, such as electronic components or variable lumbar supports, within, below and around the seat. Additionally, the size of the seat, particularly the seat back, needs to be as small as possible to reduce the amount of cabin space consumed by the seat.

Present temperature control systems are often too large to be mounted within, below or around vehicle seats. Conventional systems may have a squirrel cage fan five or six inches in diameter generating an air flow that passes through a duct to reach a heat exchanger that adjusts the temperature of the air. The heat exchanger is several inches wide and long, and at least an inch or so thick. From the heat exchanger the air is transported through ducts to the bottom of the seat cushion and to the back of the seat cushion. Such systems are bulky and difficult to fit underneath or inside car seats. Using thermoelectric devices to heat and cool the heat exchanger helps reduce the size of unit, but still requires a large volume for the combined heating and cooling system.

The ducting used with these systems is also bulky and difficult to use if the duct must go from a seat bottom to a seat back that is allowed to pivot or rotate. These ducts not only use additional space within the seat, but also resist air flow and thus require a larger fan to provide the air flow, and the larger fan requires additional space or else runs at greater speeds and generates more noise. Noise is undesirable inside motor vehicles. Further, the ducting affects the temperature of the passing air and either heats cool air, or cools heated air, with the result of often requiring larger fans or heat exchangers.

In light of these drawbacks, there is a need for a more compact and energy efficient heating and cooling system for automobile seats, and preferably a quieter system.

SUMMARY OF THE INVENTION

This device uses air flow generators, such as fan blades, that act as both a heat exchanger to transfer a thermal differential from a thermoelectric device and thereby condition air passing over the heat exchanger, and that act as an air pump. The heat exchanger rotates and provides aerodynamic and centrifugal force to the air passing through the heat exchanger to generate pressurized air for distribution, such as to the seat of a motor vehicle.

In more detail, one embodiment of this device comprises at least one annular thermoelectric device (e.g., Peltier device) that, depending on the voltage applied, heats one surface and cools the opposing surface of the annular, thermoelectric device. Annular heat exchangers are placed in thermal communication with the opposing sides of the annular thermoelectric device by mounting them directly to the thermoelectric device so that each heat exchanger conducts the heat or cold from the surface of the device to which the heat exchanger is mounted. A resistive heating element may also be used to generate heat.

In one embodiment, the annular heat exchangers are formed with radial slots extending through the heat exchanger, and form an annular cavity inside the heat exchangers when assembled. A motor nests inside the annular cavity formed on the inside of the assembled annular heat exchangers and annular, thermoelectric device, but spaced apart from the heat exchangers and thermoelectric device by an amount sufficient to allow air to flow along the exterior of the motor. The motor is drivingly connected to one of the heat exchangers and thermoelectric device to rotate them. The rotating heat exchangers act as a fan, drawing air into the annular cavity and expelling the air through the radial slots of the heat exchangers at a higher pressure. The volume of compressed air created is determined by the motor size, the fan blade shape, the rotational speed, and the overall geometry of the assembly.

This arrangement allows the heat exchanger to be directly coupled to the thermoelectric device, and to act as a fan to not only generate the air pressure that distributes the conditioned air to passenger seats, but to condition the air as the air passes through the fan blades/heat exchanger. This reduces ducting and associated pressure losses, reduces the size of the system, and increases the overall efficiency of the system which in turn allows a reduction in fan size and power requirements. The compact arrangement allows the system to be placed underneath, and preferably inside most automobile seats, which further reduces ducting and associated pressure losses, and allows further reductions in motor size and power. The result of the various reductions is some combination of a smaller system volume, less power consumption, smaller size, and generation of less noise, than previously available.

Advantageously, a seal separates the opposing sides of the rotating, annular heat exchangers to form a main, or supply side and a waste side. Air enters the assembly near the axis of rotation, which advantageously is aligned with the motor's rotational axis. The air exits radially or axially outward into a housing enclosing the majority of the annular fan/heat exchanger. An outlet in fluid communication with the main (or supply) side is in fluid communication with the seat of a passenger vehicle. An outlet in fluid communication with the waste side is also in fluid communication with an outlet at a location that will not degrade performance by allowing the waste air to be recirculated to the air entry portion. The thermoelectric creates a temperature differential between the supply side air and the waste side air. Layers of thermal insulation between the waste side and the supply side help maintain that temperature differential in portions of the assembly.

Power is supplied to the thermoelectric device by brush and slip ring assemblies on the rotational axis of the motor. When appropriate voltages and currents are applied to the thermoelectric and the motor, a flow of either cold or hot air is provided to the supply side by the heat exchanger that conducts the temperature differential throughout the heat exchanger, and heats or cools the air passing over the heat exchanger/fan blades by conduction and convection. Voltage adjustments to the motor and thermoelectric control the pressure, temperature and flow rate.

Advantageously, around a portion of the inside of the housing enclosing the annular fans, a wicking material is placed so that the material extends from the supply side to the waste side. If moisture condenses on one rotating fan, it is urged against the wicking material by centrifugal force from the rotating fan/heat exchanger. The wicking material absorbs the moisture, and transports the moisture to the opposing side where heated air evaporates the moisture and carries the moisture out of the system.

There is thus advantageously provided a system for thermally conditioning a fluid passing over a rotating heat exchanger that also causes movement of the fluid. The system comprises an electronic device selected to convert electrical energy into thermal energy producing a temperature change in response to an electrical current being applied thereto. The electronic device is mounted to rotate about a rotational axis. A heat transfer device is placed in conductive thermal communication with the electronic device and is mounted to rotate about the axis. The heat transfer device has thermally radiating surfaces arranged to produce a fluid flow across the surfaces when rotated about the axis. The electronic device can comprise a heating resistor, or a thermoelectric device that can heat or cool the fluid. Advantageously, the heat transfer device comprises a first series of outwardly-extending thermally radiating surfaces connected to a first surface of the electric device. A second series of thermally radiating surfaces may be connected to an opposing, second surface of the thermoelectric device. In a preferred embodiment, the heat transfer device is contained in a housing having at least one outlet in fluid communication with a seat.

The present invention also includes a means for producing a temperature change and a rotating supply side heat exchanger means for conducting the temperature change. The heat exchanger means further comprises fluid flow generating means for causing fluid to flow across said heat exchanger means. The fluid advantageously comprises a gas and the supply side heat exchanger means is advantageously in fluid communication with a seat to provide gas from the heat exchanger means to the seat.

The apparatus also comprises a device for thermally conditioning a fluid having a first fan rotating about a rotational axis and having a first plurality of heat exchange surfaces in conductive thermal communication with an electronic device that converts electrical energy into a temperature change. The fan is advantageously enclosed in a housing that has an outlet.

The present invention also comprises a method for thermally conditioning a fluid comprising the steps of producing a temperature change by an electronic device, conducting that temperature change to a heat exchanger having radiative surfaces, and rotating the radiative surfaces to cause fluid to flow across the radiative surfaces. Advantageously fluid from the heat exchanger is placed in thermal communication with a seat, and the fluid comprises a gas, preferably air. Alternatively, the thermally conditioned fluid is circulated to the interior of a chamber which may comprise a gas plenum, or circulated to a thermally insulated chamber provided with a closable opening to allow access to the interior of the chamber—such as a cooler.

One method for producing a very compact form of the invention is to form a first heat exchanger having radiative surfaces aligned to allow the passage of air outward from an axis about which the heat exchanger rotates. The first heat exchanger is placed in conductive thermal communication with an electrical device that generates a temperature change when an electrical current is applied to the electrical device. The first heat exchanger is then rotated about the axis. Advantageously the electrical device comprises a thermoelectric device, and when placed inside a vehicle seat, provides a compact unit for ventilating the seat.

The present invention further comprises means for producing a temperature differential and supply side heat exchanger means for conducting said temperature change, where the heat exchanger means further comprises fluid flow generating means for causing fluid to flow across said heat exchanger means. Advantageously, the supply side heat exchanger means is in fluid communication with a vehicle seat.

A further version of the invention comprises a first fan rotating about a rotational axis and having a first plurality of heat exchange elements configured to generate a fluid flow through the heat exchange elements when rotated and in conductive thermal communication with an electronic device that converts electrical energy into a temperature change. The fan is advantageously enclosed in a housing that has an outlet in fluid communication with a fluid distribution system, and preferably the electronic device comprises a thermoelectric device.

There is thus provided a system for thermally conditioning and pumping a fluid having use as a ventilation system for vehicle seats and other applications, in which an electrical resistor or thermoelectric device generates a temperature change that is conducted to a heat exchanger which forms an impeller to cause fluid to flow across the heat exchanger and thermally condition the fluid. The thermally conditioned fluid may be placed in thermal communication with a variety of objects, one of which is a vehicle seat to provide localized heating and cooling of a person sitting on the seat.

BRIEF DESCRIPTION OF THE DRAWINGS

These and other features of the invention will now be described with reference to the drawings of an embodiment in which like number indicate like parts throughout, and which are intended to illustrate and not to limit the invention, and in which:

FIG. 12 is a perspective view of another embodiment of the heat exchanger.

DETAILED DESCRIPTION

Figure 1:
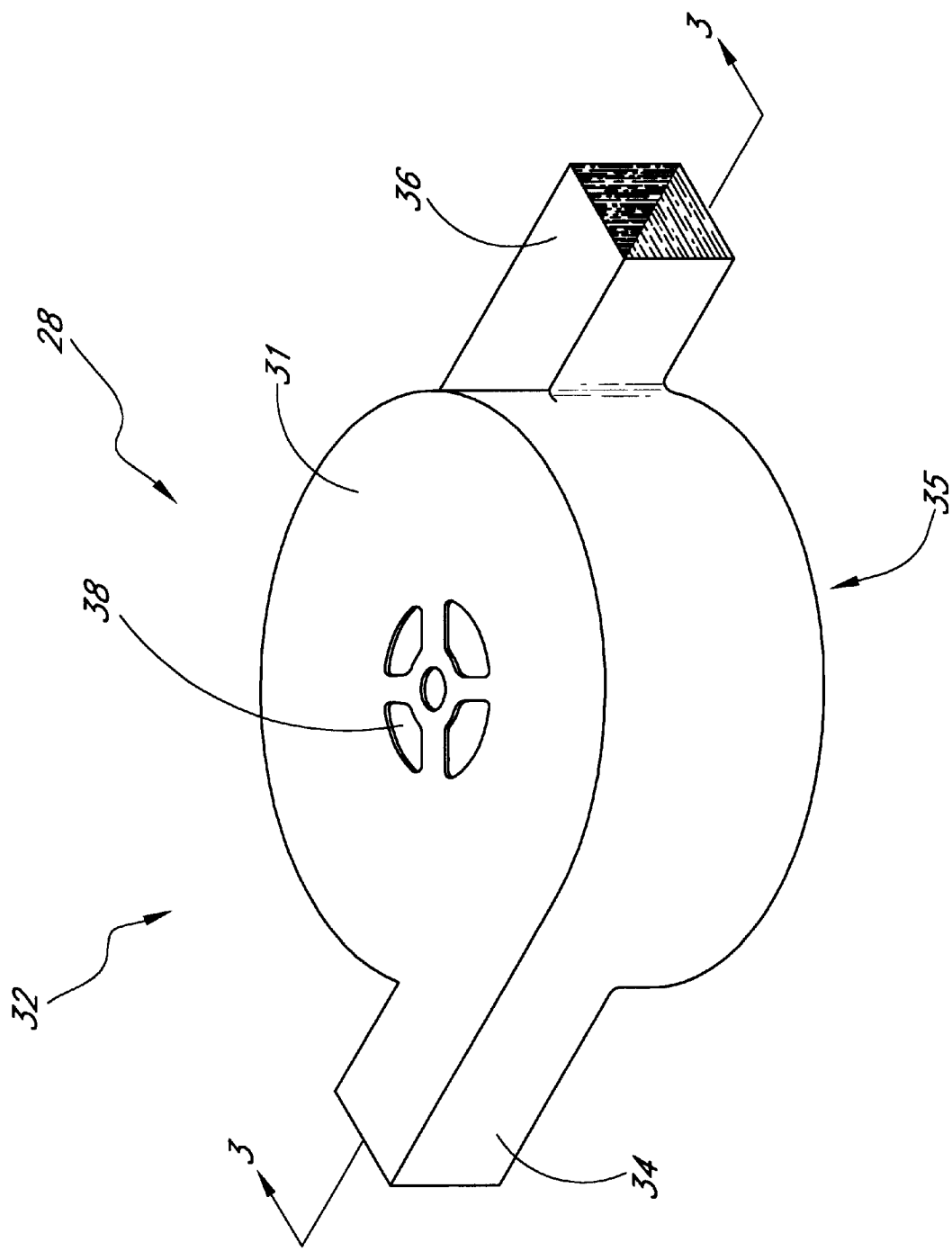
FIG. 1 is a perspective view of the heat exchanger of the present invention.

As shown in FIG. 1, the heat exchanger unit 28 of the present invention includes an outer housing 32 that defines an interior cavity 29 (FIG. 3) in which a rotor assembly 30 (FIGS. 2 and 3) is rotatably mounted for producing a conditioned airflow into and out of the outer housing 32. While other shapes are suitable, the outer housing 32 is shown as resembling a generally flat disc with a first surface or first wall 31 that corresponds to an upper or top surface if the housing 32 is placed in a seat bottom generally parallel to the ground. As used herein, up or upper will refer to a direction away from the ground. Down, lower or bottom will refer to a direction toward the ground. The relative direction of parts would alter if the entire orientation of housing 32 were changed, as may occur in actual use. A second wall 33, corresponding to a bottom surface, is opposite the first wall 31. The generally circular peripheries of walls 31, 33 are joined by side wall 35 to form an enclosure.

A first outlet 34 extends outwardly from the side wall 35 adjacent the first or upper wall 31 of the outer housing 32. A second outlet 36 extends outwardly from the side wall 35 adjacent the second, or lower wall 33. Advantageously the outlets 34, 36 extend generally tangential from the periphery of the housing 32. The outlets 34, 36 are shown extending in generally opposite directions, about 180° relative to each other. But depending on the particular direction the air needs to flow, the outlets 34, 36 could be located at other angles relative to each other, with 60°, 90° on either side of the housing 32, being the most likely relative positions. The outlets 34, 36 could exit in the same direction if desired, but then it would be advantageous to have insulation between the outlets to help maintain the temperature differential between the outlets.

A set of apertures 38 are centrally formed in the first or top wall 31 of the outer housing 32 to form a first inlet 38 that communicates with the interior cavity 29 formed and enclosed by the outer housing 32. Although not necessary, a second inlet 40 (FIG. 3) may also be located on the second or bottom wall 33 of the outer housing 32 opposite the first inlet 38.

Figure 2:
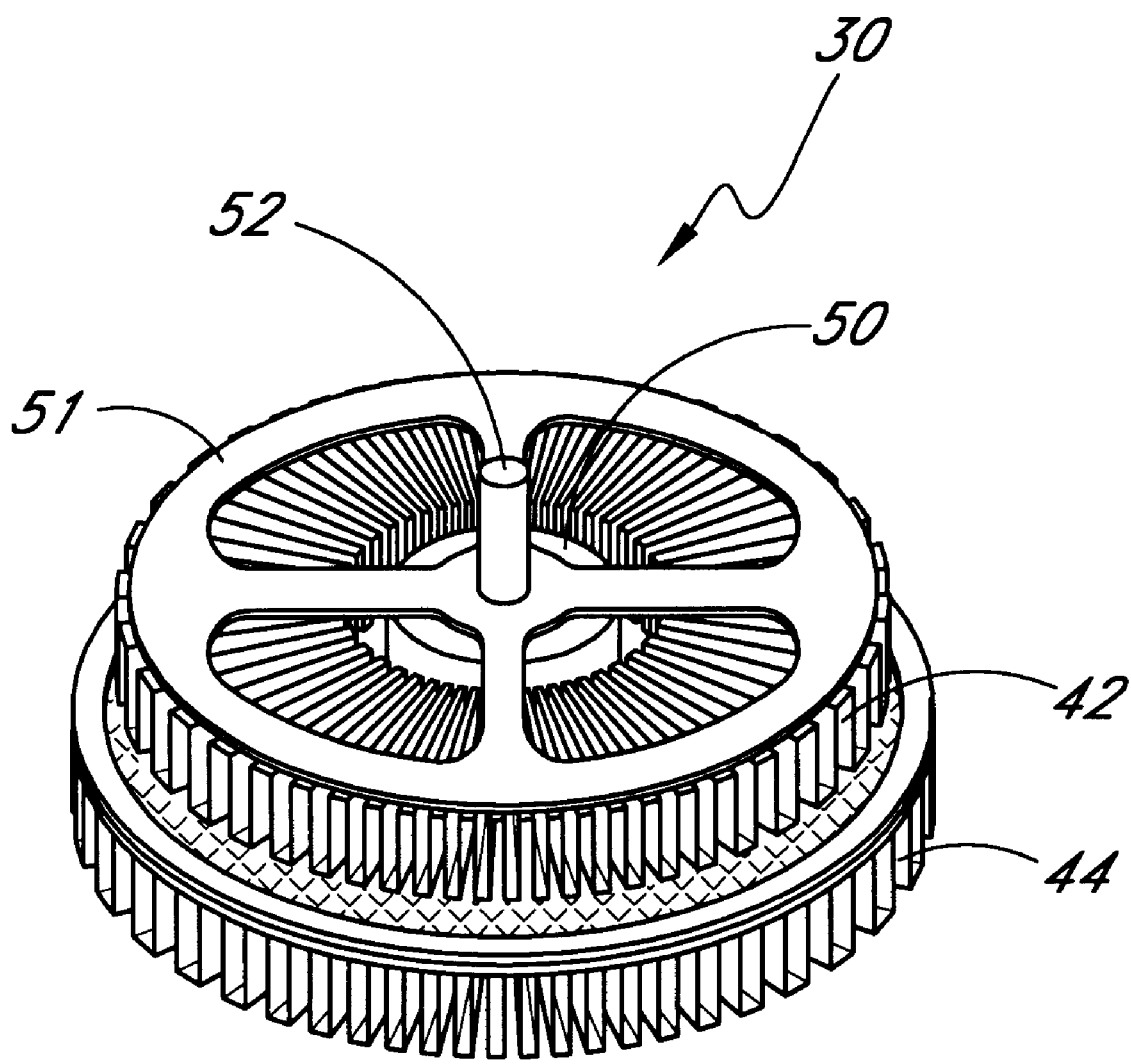
FIG. 2 is a perspective view of a rotary assembly of the heat exchanger of FIG. 1.
Figure 3:
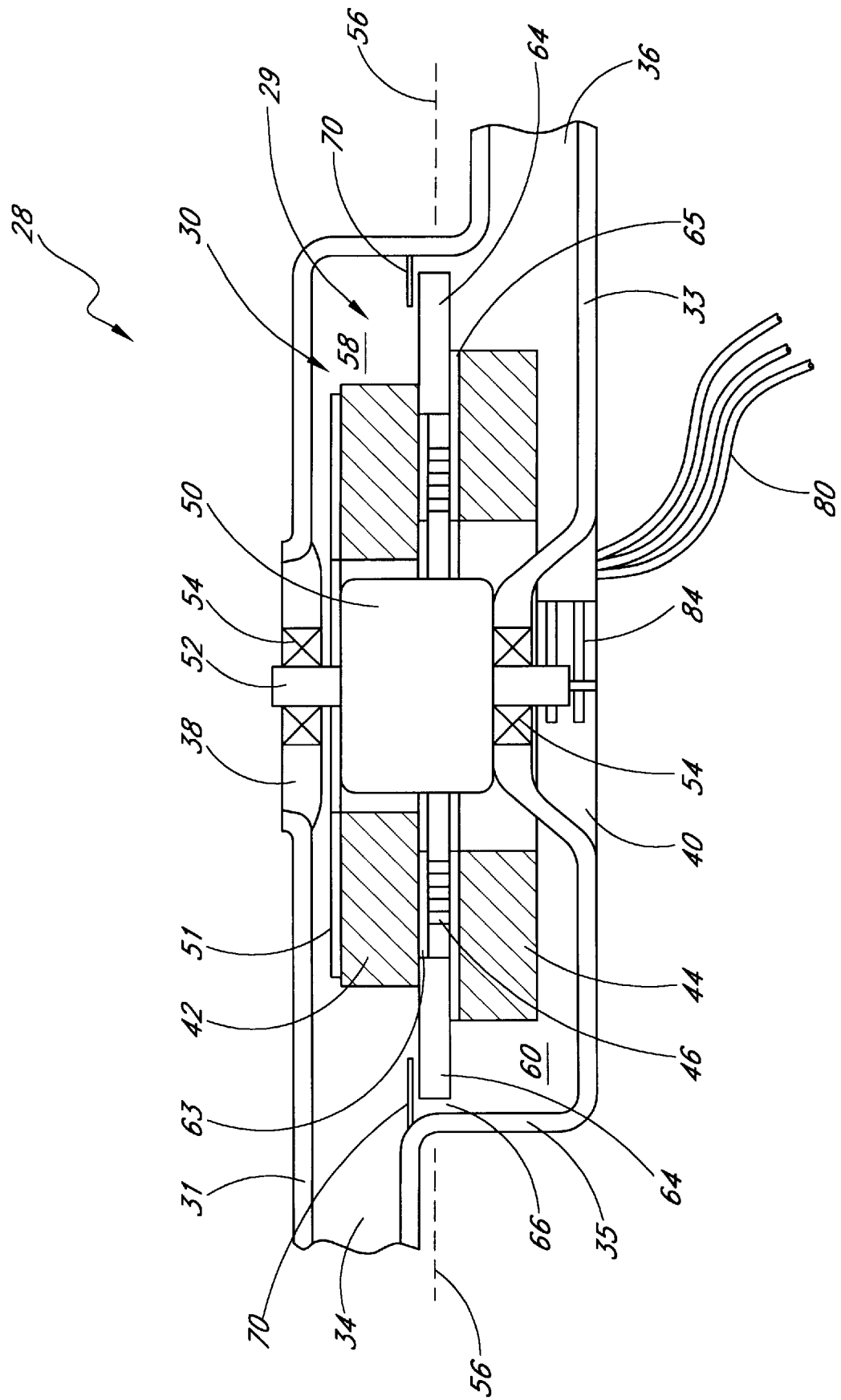
FIG. 3 is a cross-sectional view of the heat exchanger along line 3—3 of FIG. 1.

Referring to FIGS. 2 and 3, the rotor assembly 30 generally comprises a plurality of components including an annular first rotor 42, an annular second rotor 44 disposed below the first rotor 42, and at least one annular thermoelectric device 46 interposed between, and in thermal communication with, the first rotor 42 and the second rotor 44. The thermoelectric device is also known as a Peltier device which comprises at least one pair of dissimilar materials connected electrically in series and thermally in parallel, and typically comprises a series of n-type and p-type semiconductor elements connected electrically in series and thermally in parallel. Depending on the direction of current passing through the thermoelectric device 46, one surface will be heated and the opposing surface will be cooled. The thermoelectric device 46 generates a temperature differential that causes heat to transfer by conduction through the rotors 42, 44. The greater the temperature differential, the greater the rate of heat transfer. Current thermoelectric devices can generate a temperature differential of 70° C. across the opposing surfaces of the thermoelectric device, and if the devices are stacked, temperature differentials of 130° C. are currently possible. The temperature differentials and efficiencies are expected to increase as the technology improves.

The rotors 42, 44 comprise annular heat exchangers in direct thermal communication with the thermoelectric device 46 to conduct heat throughout the rotors 42, 44, primarily by thermal conduction to thereby form a short thermal path length between the rotors 42, 44 and the thermoelectric device 46. Depending on the material and construction of the rotors 42, 44, the rate of thermal conduction will vary. The rotors 42, 44 also allow air to pass outward, such as in a radial direction, through the heat exchanger, and further comprise blades of fans that cause the air to pass outward through the rotors 42, 44. The heat exchanger thus forms the fan that causes the air to flow through the heat exchanger. Alternatively phrased, the fan that generates the air flow also forms the heat exchanger. In one embodiment, the fins of the heat exchanger comprise the blades or airfoils of the fan generating the air flow. Alternately, the heat exchanger could comprise a series of heat exchange surfaces that are configured to generate an airflow when the surfaces are rotated.

The rotors 42, 44 are advantageously formed by taking a length of heat exchanger of aluminum or copper that is formed from a flat strip of metal having corrugated or accordion-like pleats folded so heat sinks and sources can be connected at the ends of the pleats where the metal folds to change direction. The pleats are orientated so air can flow along the corrugations of the heat exchanger. The opposing ends of that length of heat exchanger are curved toward each other, and then overlapped and fastened together either mechanically or by thermal or adhesive bonding. This bending forms the previously straight length into a circle so the air flows radially through what is now a circular heat exchanger. In this annular configuration the heat exchanger can effectively act as the blades of a squirrel cage fan or a circular fan. This method is advantageously used to form both the first rotor 42 and the second rotor 44.

In the illustrated embodiment, the first rotor 42 is located on the supply side of the heat exchanger that supplies conditioned air to a user, and has an outer diameter that is smaller than the diameter of the second rotor 44. The second rotor 44 is located on the waste side of the system and exhausts conditioned air, advantageously to a location that does not direct air to the supply side or that otherwise directs air to a location that could affect the user. Each of the components are axially aligned to rotate about a central axis aligned with a drive shaft or axle 52 of motor 50. A disc-shaped connector 51 having a central aperture is disposed on top of the first rotor 42 and the motor 50. The motor 50 may be directly coupled to the axle 52 or could be indirectly coupled, such as via a gear assembly.

The connector 51 mechanically couples at least one of the shaft 52 or motor 50 to the first rotor 42 so that the motor 50 is configured to rotatably drive the first rotor 42, the thermoelectric device 46, and the second rotor 44 about a common axis, as described in more detail below. The interior diameter of rotors 42, 44 is advantageously large enough to allow motor 50 to be inserted inside the space formed inside the annular rotors 42, 44, to minimize the height of the unit along the longitudinal axis about which rotors 42, 44 rotate.

As shown in FIG. 3, the rotor assembly 30 is mounted within the outer housing 32 on a drive axle 52 that, in the illustrated embodiment, is journaled at opposing ends of the axle on shaft bearings 54 which are advantageously mounted to walls 31, 33. The drive axle 52 of the rotor assembly 30 is axially aligned with the first and second inlets 38 and 40 of the outer housing 32. The outer housing 32 could also be equipped with only a single inlet or with more than two inlets.

The plane of the thermoelectric device 46 defines a boundary line 56 that divides the interior cavity 29 into an upper portion or supply side 58 and a lower portion or waste side 60. The first rotor 42 is located within the upper portion or supply side 58 and the second rotor 44 is located within the lower portion or waste side 60.

As best shown in FIG. 3, the rotor assembly 30 further includes a first annular plate 63 that is disposed between a top edge of the thermoelectric device 46 and a bottom edge of the first rotor 42. A second annular plate 65 is disposed between a bottom edge of the thermoelectric device 46 and the top of the second rotor 44 so that the thermoelectric device 46 is interposed between the first and second plates 63 and 65. The first and second plates 63 and 65 are preferably manufactured of a material that is thermally conductive but is electrically insulative, such as, for example, alumina. In one embodiment, a heat-resistant, thermally-conductive adhesive, such as silver-filled silicon adhesive, is used to mount the first rotor 42 to the first plate 63 and the second rotor 44 to the second plate 65. Alternately, plates 63 and 65 may be omitted and the first and second rotors 42 and 44 may be directly attached to the thermoelectric device 46.

An annular, disc-like insulation member 64 of thermally insulated material extends from between the rotors 42, 44, radially outward and ends before it hits the inside of the side walls 35. Advantageously the member 64 is positioned on top of the second annular plate 65 adjacent the inner and outer periphery of the thermoelectric device 46 and is placed generally in the plane containing boundary line 56. The insulation member 64 is dimensioned to extend radially inward and outward from the thermoelectric device toward the motor 50 along the boundary line 56. A gap 66 is defined between the outer periphery of the insulation disc 64 and the interior surface of the outer housing 32, with the gap 66 forming an air bearing to reduce the passage of air across the gap 66.

Figure 4:
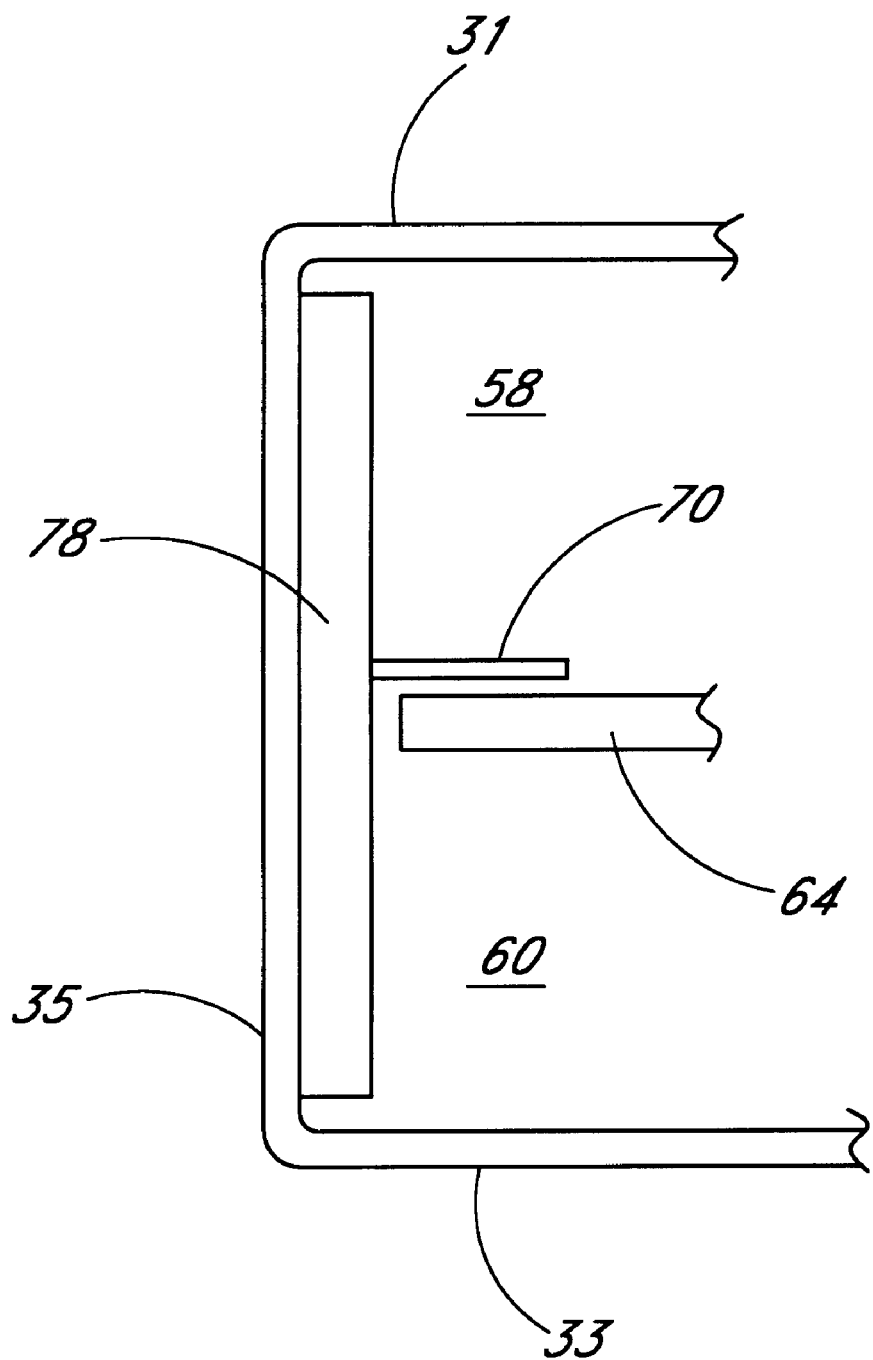
FIG. 4 is an enlarged cross-sectional view of a portion of the heat exchanger.

As shown in FIGS. 3 and 4, a thin and flexible annular seal 70 of thermally insulated material is positioned so as to extend radially inward from the interior surface of the outer housing 32 generally along the boundary line 56. The annular seal 70 is preferably sized so that it overlaps, but does not contact the adjacent surface of the insulation member 64. The annular seal 70 cooperates with the insulation member 64 to define a labyrinth seal around the outer periphery of the member 64 that thermally insulates the upper portion or supply side 58 of the interior cavity 29 from the lower portion or waste side 60 of the interior cavity 29. The insulation member 64 and annular seal 70 prevent significant heat convection between the waste and main sides. The annular seal 70 can be in the form of an air bearing that facilitates rotation of the rotor assembly 30. The insulation member 64 may comprise any of a wide variety of heat resistant, thermally-insulative materials, such as expanded polypropylene.

With reference to FIG. 4, at least a portion of the interior surface of the housing 32 advantageously is coated with a wicking material 78 that is adapted to absorb and conduct moisture. The wicking material 78 extends between the upper and lower portions 58, 60, and advantageously comprises a woven cotton fabric that has been texture coated to prevent microbe growth. The wicking material 78 absorbs condensed moisture expelled by centrifugal force from whichever rotor 42, 44 produces the condensation, and conducts the moisture to the other rotor where it is evaporated by the heated air—in order to avoid accumulation in the interior cavity 33 and in passages distributing the cooled air. Advantageously the wicking material 78 absorbs enough moisture to prevent accumulation in the downstream passages in fluid communication with whichever rotor 42, 44 is cooled prompting a potential for condensation.

The annular seal 70 must allow the wicking material 78 to pass. Thus, the seal 70 may be connected to an exterior surface of the material 78, may extend through the material 78 at intermittent locations, or may connect to side walls 35 at locates where the material 78 is absent. The material 70 could also extend outside of the interior cavity 33.

Referring to FIG. 3, electrically-conductive wires 80 are electrically coupled to the thermoelectric device 46 to provide an electrical potential thereto in a well known manner through brushes 84 that are in electrical communication with the rotating drive axle 52. Because electrical current must be provided to the thermoelectric device 46 in a closed circuit, two brushes 84 are in electrical communication with the axle 52 and thermoelectric 46 through brush and slip-ring assemblies known in the art. Other electrical connections, such as, for example, an inductive coupling, can be devised given the present disclosure.

Figure 5:
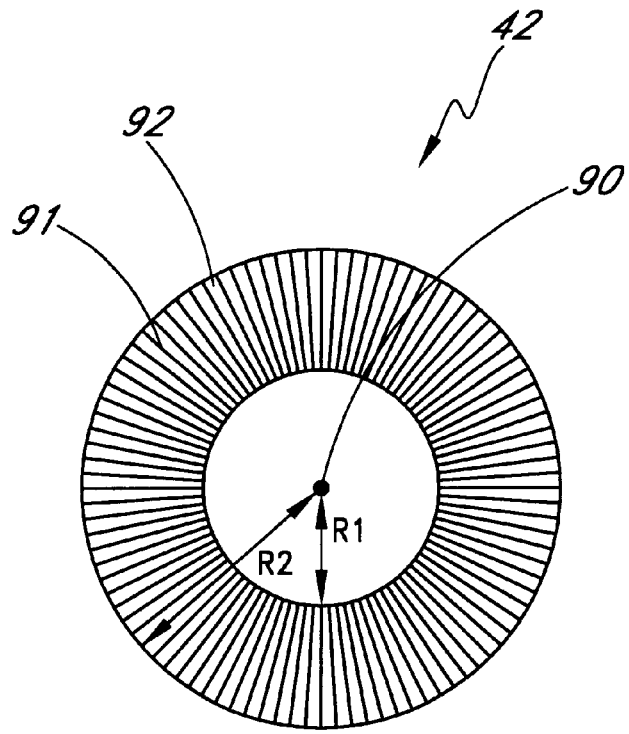
FIG. 5 is a top view of a rotor used with the heat exchanger.
Figure 6:
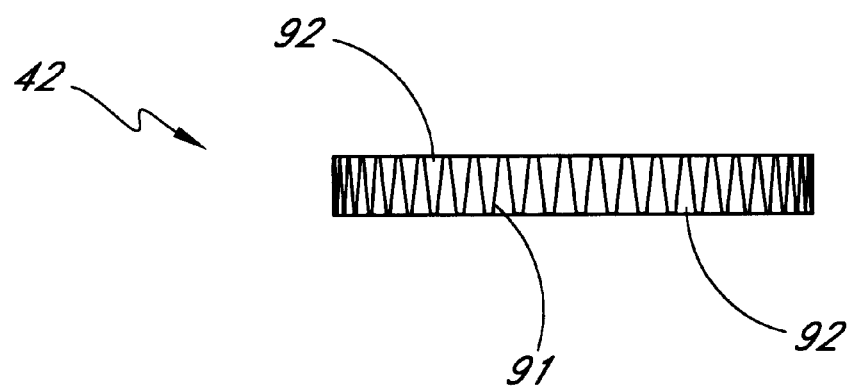
FIG. 6 is a side view of the rotor of FIG. 4.

FIGS. 5 and 6 are top and side views, respectively, of the first rotor 42. The structure of the second rotor 44 may be identical to that of the first rotor 42, although the respective dimensions may differ. The following more detailed description of the first rotor 42 is therefore equally applicable to that of the second rotor 44. The first rotor 42 comprises a strip of corrugated metal having two connected ends so that the first rotor 42 is annular in shape. The corrugations or accordion-like pleats in the first rotor 42 form a series of radially-extending fins or blades 91 that define a series of radially-extending chambers or spaces 92 therebetween. Referring further to FIG. 4, the width (i.e., the circumferential distance between adjacent fins 91) of the chambers 92 gradually increases moving radially outward from a center point 90 of the first rotor 42. Each rotor 42 and 44 has an inner radius $R_1$ and an outer radius $R_2$. The spacing between adjacent fins 91 is sufficiently wide at the inner radius $R_1$ to allow air flow radially outward through the rotor 42.

In the illustrated embodiment, the blades 91 comprise generally flat walls that are connected and extend radially outward from a center point 90 on the rotational axis of the rotor 42. This design is not believed optimum from the aerodynamic viewpoint of moving the maximum volume of air through the rotor 42 for a given rotational speed or rotor size. The blades 91 may also be aerodynamically configured to provide various airflow profiles. For example, the blades 91 may be s-shaped, c-shaped, etc. Alternately, the blades 91 may comprise any type of straight or curved surface that produces an airflow when the surfaces are rotated.

The outer radius $R_2$ preferably ranges from approximately 12–75 mm when incorporated into a temperature control system for a motor vehicle seat. The radial length of the blade 91, the difference between the inner radius $R_1$ and outer radius $R_2$, is approximately 10–40 mm when the heat exchanger 28 is incorporated into a temperature control system for a motor vehicle seat, as described below with reference to FIG. 7. The blades 91 may have a height measured along the rotational axis, in the range of approximately 6–15 mm when used with car seats. Adjacent blades 91 are preferably spaced apart a distance of approximately 0.5–2 mm for a temperature control system for a seat. The thickness of the blades 91 when made of copper or aluminum is preferably in the range of approximately 0.05–0.2 mm when incorporated into a car seat.

In an alternative embodiment, the thermoelectric device 46 is replaced by a resistive heating element which converts electrical energy into heat energy. This resistive heating element does not have the cooling capability of the thermoelectric device 46, but it does provided heat air which may have wider applicability in certain climates.

Referring to FIG. 3, in operation, the motor 50 rotate the axle 52 by activating the power source through a control, such as a manual switch or a thermostatically controlled switch. The motor is in driving communication with the first rotor 42, the second rotor 44, and the thermoelectric device 46 so as to rotate those components about the rotational axis of drive axle 52. The rotation of the first rotor 42 creates a pressure differential that draws air into the supply side 58 of the interior cavity 29 through the first inlet 38. The air flows into the spaces 92 and radially outward across the blades 91 of the first rotor 42. The rotation of the rotor 42 imparts centrifugal force to the air that propels the air radially outward from rotor 42 so that the air travels out of the supply side 58 of the interior cavity 29 through the first outlet 34.

In a similar manner, the second rotor 44 also rotates and draws are into the lower portion or waste side 60 of the interior cavity 29 through the second inlet 40 (or through either inlet 38 or 40 if only one inlet is provided). The air passes through the spaces 92 between the blades 91 of the second rotor 44, radially outward across blades 91, and is propelled out of the waste side 60 through the second outlet 36. The divider 64 keeps the air flows from intermingling, and because it is thermally insulated, maintains a temperature differential between the supply side 58 and waste side 60.

The electrical wires 80 also supply an electrical current to the thermoelectric device 46, advantageously through shaft 52, so that the thermoelectric device 46 heats the rotor 42 and cools rotor 44, or cools rotor 42 and heats rotor 44, depending on which direction the electrical current flows through the thermoelectric divide 46. As the air flows across the blades 91 of the first rotor 42 and the second rotor 44, the air is either heated or cooled through a convective process. That is, on the hot side of the thermoelectric device 46, heat is transferred to the air from the heated fins of the rotor as the air flows thereover. On the cooled side of the thermoelectric device, heat is absorbed from the air as the air passes over the cooled rotor to thereby cool the air. The heat exchanger thus produces heated air through one outlet and cooled air through the other outlet. The heated or cooled air is then directed to the appropriate location in the seat for heating or cooling the passenger seat. The air with the undesired temperature is vented to a location where it will not noticeably affect the vehicle passengers. Preferably, the waste air is vented to a location such that the waste air is not drawn back into the outer housing 32.

The first rotor 42 and the second rotor 44 simultaneously function as fan units for generating an airflow at a predetermined pressure and also as heat exchangers for transferring heat to and from the airflow and maintaining the airflow at the desired temperature. By combining the heat exchanger function into the fan that generates the air flow, several advantages are achieved. By forming the heat exchanger into an annular fan and nesting the motor inside the heat exchanger/fan, space and weight savings are achieved.

Currently used systems are about 45 mm in height, which is too big for many motor vehicles. Newly designed systems are about 30 mm in height, but a great number of motor vehicles still have seats too small to accommodate such fans underneath or around the seat, and few can accommodate that size within the seat. Fan and heat exchanger units 28 with a height below about 20–30 mm will accommodate a majority of automotive seats, and the present invention can allow such construction. But systems 28 of the present invention having a height of about 16 mm are believed possible, which is about half the height of the smallest systems currently available, and small enough to allow the use of the heating/cooling system inside a significant majority of seat bottoms and seat backs currently used in motor vehicles.

This height reduction represents the distance between walls 31, 33 and associated ducting to carry the air to the location within the seat. The design of rotors 42, 44 can be used to vary the dimensions, with the heat exchanger surface area of blades 91 being a compromise between blade height, blade length, and diameter, and that area must be offset by the change in performance and rotational speed of the fan. Also, shorter rotors 42, 44 can be achieved by increasing the diameter of the rotors or by operating the rotors at higher speeds, which may increase noise.

Further, the design eliminates the interconnecting ducting between the fan and the heat exchanger, saving weight, size and pressure losses in the transmitted air. The small size also allows placement of heating and cooling systems directly in the seat bottoms and backs, further reducing the need for ducting, and especially reducing the need for ducting across the pivoted joints between seat bottoms and backs. The reduced ducting and its associated pressure losses and performance degradation, also allows the use of smaller fans, which use less energy and generate less noise.

Moreover, the consolidation of several parts and functions allows a reduced manufacturing cost and an increase in efficiency of the system. The drag normally caused by passing the air over the heat exchanger is significantly reduced because the heat exchanger forms the fan blades that generate the air flow. Thus, savings of about 25%–35% of the fan power are believed possible. Further, adequate heating and cooling of a motor vehicle seat are believed to use about 1000 watts less than the power needed to provide the same comfort level to a passenger using the heating and cooling system of a motor vehicle—which must heat and cool the entire passenger compartment rather than the localized environment of the seat on which the passenger sits.

A further advantage is the reduction of noise because two small fans can be used. The rotors 42 and 44 preferably operate at a rotational speed in the range of approximately 2,000–5,000 revolutions per minute, although speeds of about 1000 rpm may be desirable in some applications, and higher speeds of up to 10,000 revolutions per minute in others. The rate of airflow of the main side of the heat exchanger is in the range of approximately 2–6 cubic feet per minute at a pressure of about 0.2–1 inches of water, with a flow rate of about 3–4 cfm being preferred. The rate of airflow of the waste side of the heat exchanger is in the range of approximately 2–10 cubic feet per minute, at a pressure of about 0.3–0.4 inches of water. The rotors 42, 44 with the blades acting as conductive heat exchanger as well as fan blades to move air, provide these needed air flows. In typical automobile use, 12 volt motors drive the rotors 42, 44. This fan flow rate and pressure are smaller than in prior seat systems where the fan had to generate enough pressure and air flow to provide air to both the bottom and backrest portions of the seat.

To further enhance the above advantages, in a further embodiment the blades 91 may comprise a series of independent walls mounted on an annular plate where the blades 91 are contoured or curved to provide a preselected airflow profile when the first rotor 42 rotates, advantageously a profile that is more efficient than the straight blades 91 described above while still conducting heat well and maintaining a low manufacturing cost. Further, the blades 91 as illustrated and described above are not optimized for minimizing noise, and noise reduction is an important consideration for equipment operating inside the passenger compartment of motor vehicles. A more refined design of the blades 91 could advantageously reduce noise. It is believed that the level of noise generated by rotation of the rotors 42 and 44 generally decreases as the number of blades 91 increases. To accommodate the thermal transfer use of the rotor blades 91, more blades are likely to be required than may be desirable for optimum performance if the rotors 42, 44 were designed solely for use as fans to move air—without regard to the heat transfer function and noise of the rotors 42, 44.

The compact design also reduces the weight of the unit. As mentioned, the blades 91 are preferably manufactured of a thermally conductive material, such as pure annealed aluminum, carbon, and copper, which are known to be highly thermally conductive materials. Other material may be used as scientific advances in conductive material are made. While copper is heavier than aluminum, its increased thermal conduction properties offer advantages and design options in configuring the rotor blades 91 to perform both heat transfer and air movement functions. The blades preferably have a thermal conductivity rate of greater than about 12 w/m·°K.

The conditioned air that flows out of the first and second outlets 34 and 36 may be put to any of a wide variety of uses. In one embodiment, the heat exchanger 28 is incorporated into a ventilation system for vehicle seats, such as for automobiles, as described below with reference to FIG. 7. It will be appreciated that the heat exchanger 28 could also be used in other applications as well.

Figure 7:
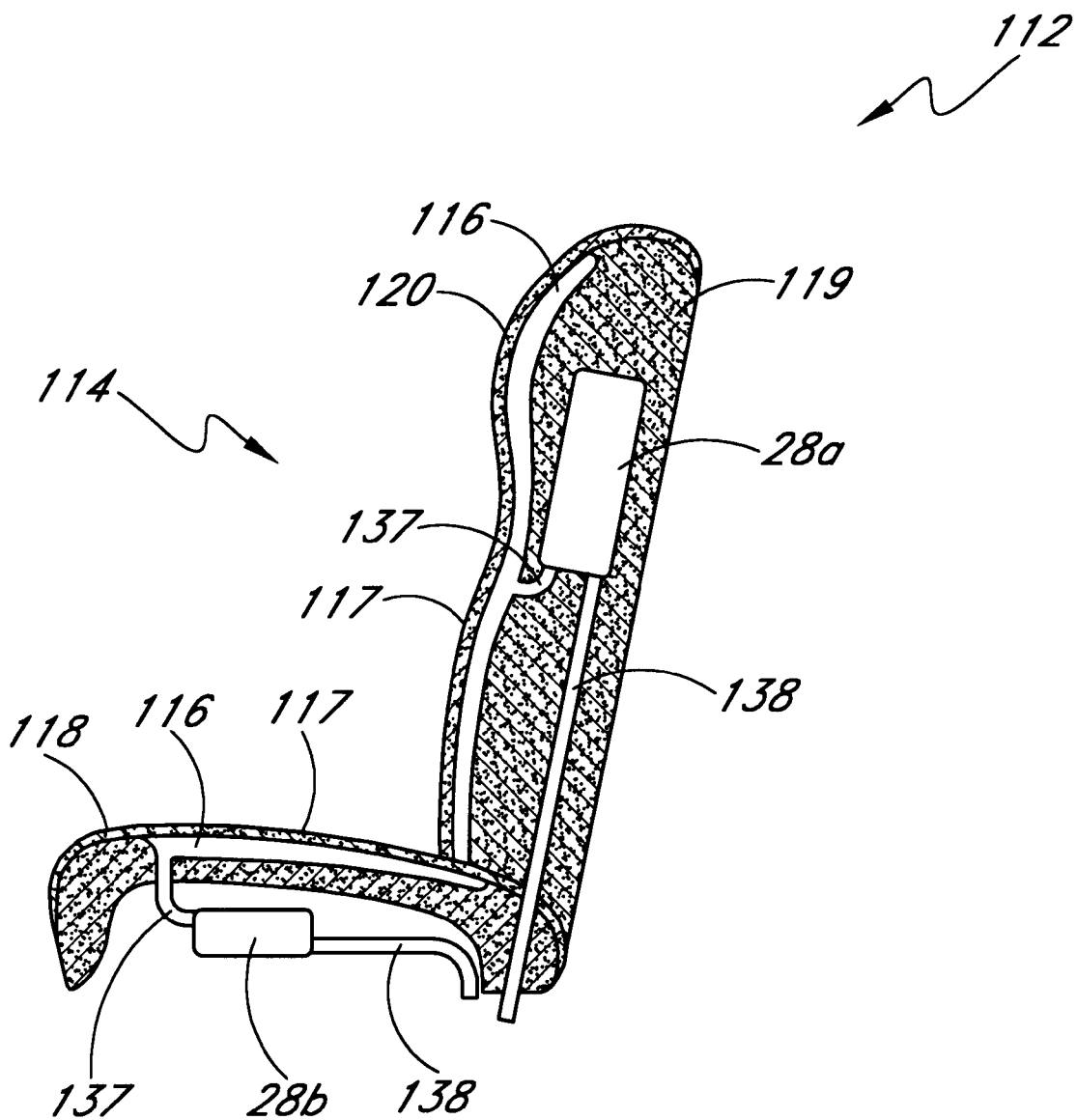
FIG. 7 is a schematic view of a seat temperature control system incorporating the heat exchanger of the present invention.

Referring to FIG. 7, an automobile seat temperature control system 112 comprises at least one seat 114 and a pair of heat exchangers 28a and 28b (referred to collectively as "heat exchangers 28") mounted therein. The heat exchangers 28 are of the type described above with reference to FIGS. 1–6. In the illustrated embodiment, the first heat exchanger 28a is mounted within a seat bottom 118 and the second heat exchanger 28b is mounted within a seat back 120. The heat exchangers may also be mounted adjacent any portion of the seat 114, such as below or on the side of the seat 114.

The seat 114 has a series of channels 116 for the passage of air. An outer covering 117 of the seat 114 surrounds a padding layer 119 through which the channels 116 extend. The outer covering 117 is desirably perforated or air-permeable to allow air to flow therethrough from the channels 116. The seat 114 also includes seat bottom 118 and seat back 120 extending upwardly therefrom for supporting a human body in a sitting position. The outer covering 117 may comprise any well known material for covering seats, such as perforated vinyl, cloth, perforated leather, etc. The padding layer of the seat 114 may comprise any well-known material for enhancing user comfort, such as reticulated foam.

With reference to FIG. 7, the first outlet 34 (FIG. 1) of the first heat exchanger 28a is attached to channels 116 that extend through the seat back 114. The first outlet 34 of the second heat exchanger 28 is attached to the channels 116 that extend through the seat bottom 118. Each of the heat exchangers 28 is electrically coupled to a power source via a control switch so that a user may selectively power the heat exchangers via the power switch. A control switch is also coupled to the heat exchangers 28 for reversing the polarity of the electrical current applied to the heat exchangers 28 in a well known manner. The control switch is used to switch the heat exchangers 28 between a heating and a cooling mode. In the heating mode, the heat exchangers 28 pump heated air into the seat 114. In the cooling mode, the heat exchangers pump cooled air into the seat 114. The heat exchangers 28 may also be coupled to separate power and temperature controllers for providing independently-controlled conditioned airflow to the seat back 114 and the seat bottom 120.

A feedback control system including a temperature sensor, such as a thermocouple, may also be provided. The system 112 may also be equipped with a control system for varying the speed of the rotors 42 and 44 to vary the flow rate. Those skilled in the art will appreciate that any of a wide variety of control devices may also be provided.

The channels 116 may comprise a series of plastic ducts or pipes that are coupled to at least one of the first and second outlets 34, 36 of the heat exchangers 28 and disposed within the seat 114. Advantageously, the ducts may be formed by heat sealing the plastic foam of which the seat is made, or by coating the duct with a sealant to reduce air loss through the duct. The channels could also comprise air gaps within a permeable material, such as reticulated foam, that allow air to flow therethrough. Additionally, the channels may comprise any type of passage for the flow of air, such as ducts, pipes, small holes, etc.

Preferably, a main duct 137 is connected to the first outlet 34 for routing the cooled or heated air to the seat 114 surface 117 via the channels 116. A waste duct 138 is connected to at least the second outlet 36 for routing the unwanted "waste" air to the outside environment away from the passenger occupying seat 114.

In operation, the power switch is activated to supply an electrical current to the heat exchangers 28. As discussed above, the thermoelectric device 46 and the main and second rotors 42 and 44 combine to generate a flow of heated or cooled air which is routed to the main ducts 137 and throughout the seat 114. The conditioned air flows out of the channels 116 through the permeable outer covering 117 to thereby cool or heat the occupant of the seat 114. Desirably, the waste air is routed away from the seats 114 through the waste ducts 138.

The waste ducts 138 can advantageously vent below the seat bottom 118 because the heating and cooling system in the passenger compartment can produce typically over 20 times the amount of heat or cool air as is exhausted through waste duct 138. As long as the waste ducts 138 do not vent directly on a passenger, toward a passenger, or on the inlets 38, 40 the environmental heating and cooling equipment will amply dissipate the output from waste ducts 138. A waste duct 138 connecting unit 28a located in the back portion 119 can vent below the seat bottom 118 without having a duct extend across the pivoted joint between the bottom portion 118 and backrest 119. Because the airflow of waste duct 138 is downward toward the seat bottom 118, two aligned openings, one at the bottom of back portion 119, and one in the seat bottom 118, are sufficient to convey the air to below the seat bottom 118.

Figure 8:
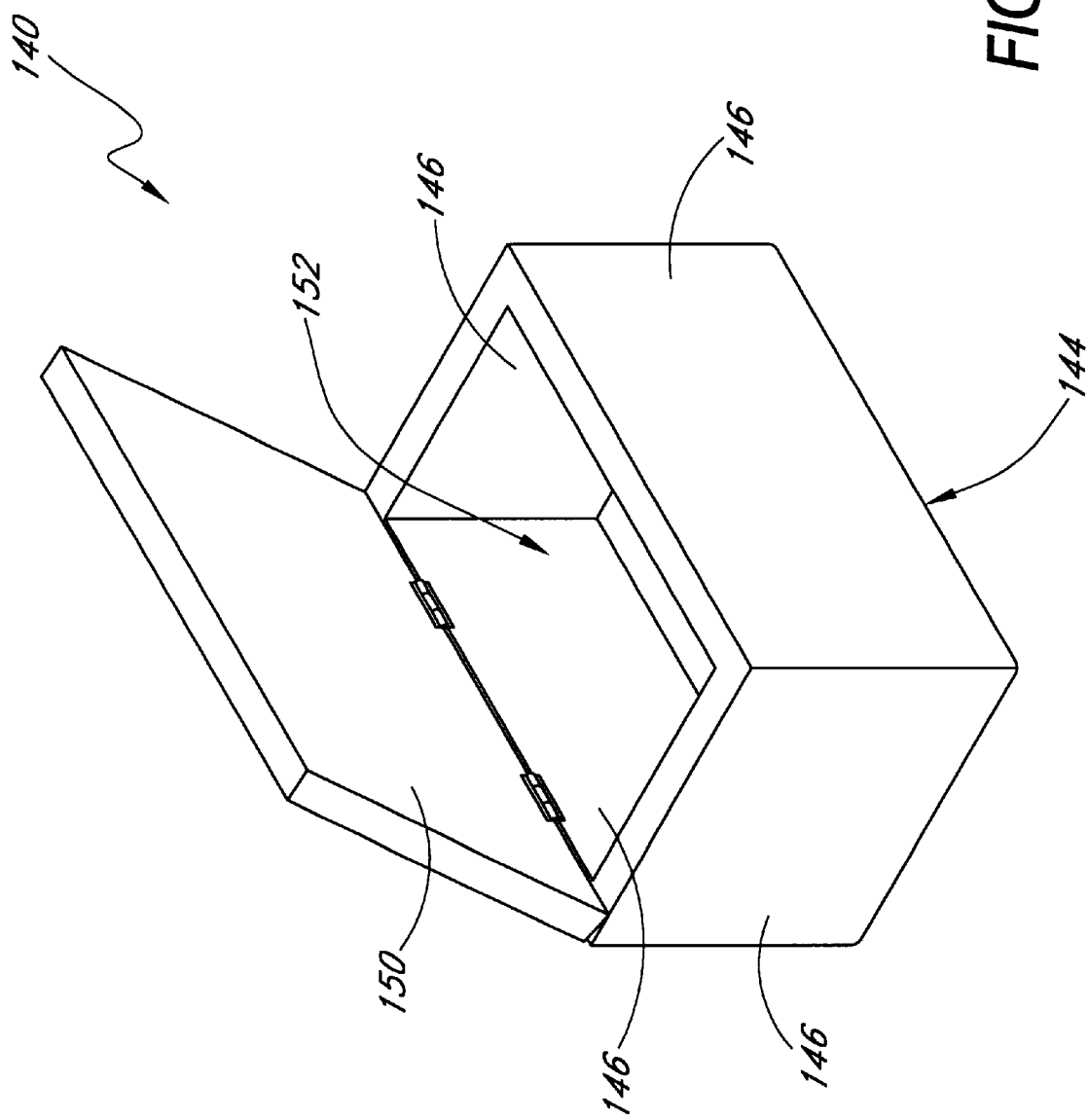
FIG. 8 is a perspective view of a cooler box that incorporates the heat exchanger.

As shown in FIG. 8, in another embodiment, the heat exchanger 28 is incorporated into a cooler, such as an ice chest 140. In the illustrated embodiment, the ice chest 140 comprises a rectangular box that includes a base wall 144 and four side walls 146 extending upwardly therefrom. A lid 150 is pivotably mounted on the four side walls 146 in a well known manner to provide access to a storage space 152 defined by the walls of the ice chest 140. The walls of the ice chest are desirably insulated in a well known manner to maintain the temperature of the storage space 152.

Figure 9:
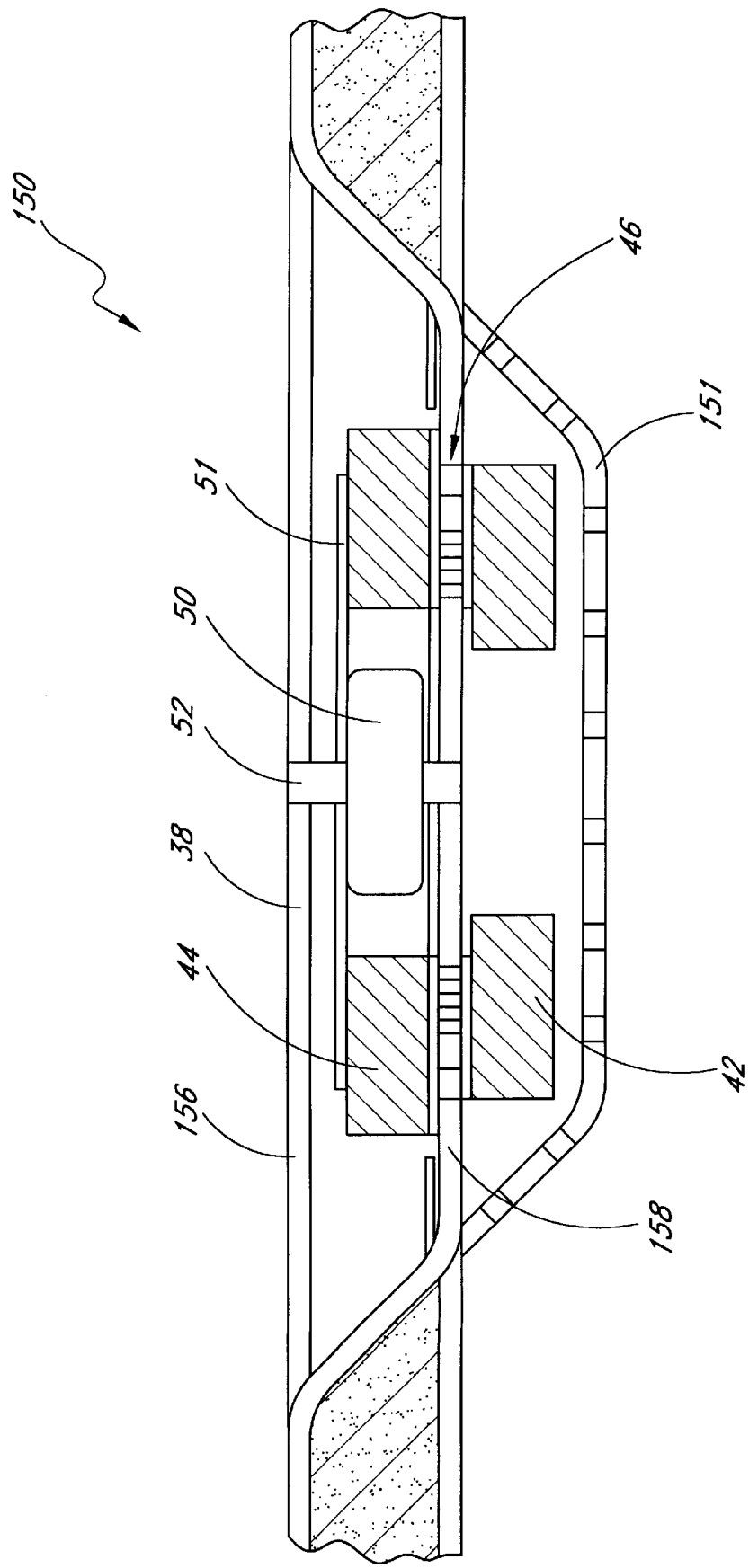
FIG. 9 is a cross-sectional side view of a lid of the cooler box of FIG. 8.

FIG. 9 is a cross-sectional side view of the lid 150 of the ice chest 140. At least one heat exchangers 28 of the type described above with reference to FIGS. 1–6 is disposed within the lid 150. The heat exchanger 28 is connected to a power source (not shown), such as a battery of the proper voltage and power, and is configured to operate in a cooling mode such that it outputs a flow of cold air at the first fan 42, as described above. The heat exchanger 28 is rotatably mounted within the lid 150 such that the waste side of the heat exchanger 28 is positioned between top and bottom walls 156, 158, respectively, with an insulation member positioned to thermally separate the main and waste sides. The main side of the heat exchanger 28 is disposed immediately below the bottom wall 158. A cover unit 159 is positioned over the main side of the heat exchanger 28. The cover unit 159 includes a series of apertures to allow air to flow through the main side of the heat exchanger 28. The main side of the heat exchanger 28 is positioned within the storage space 152 of the ice chest 140 when the lid 150 is closed.

The waste side of the heat exchanger 28 is disposed between the top and bottom walls 156 and 158 of the lid 150. An inlet 38 extends through the top wall 156 to allow air to flow into and out of the heat exchanger 28. The lid 150 is preferably filled within insulative material around heat exchanger 28.

In operation, the heat exchanger 28 is powered in the cooling mode so that the first fan 42 generates a flow of cooled air within the storage space 152 when the lid 150 is closed. In this manner, the storage space 152 is maintained at a relatively cool temperature. The heated waste air is routed to the outside environment such as through an outlet in the top wall 156 of the lid 150. Any of a wide variety of articles, such as food, may be stored within the storage space 152.

Figure 10:
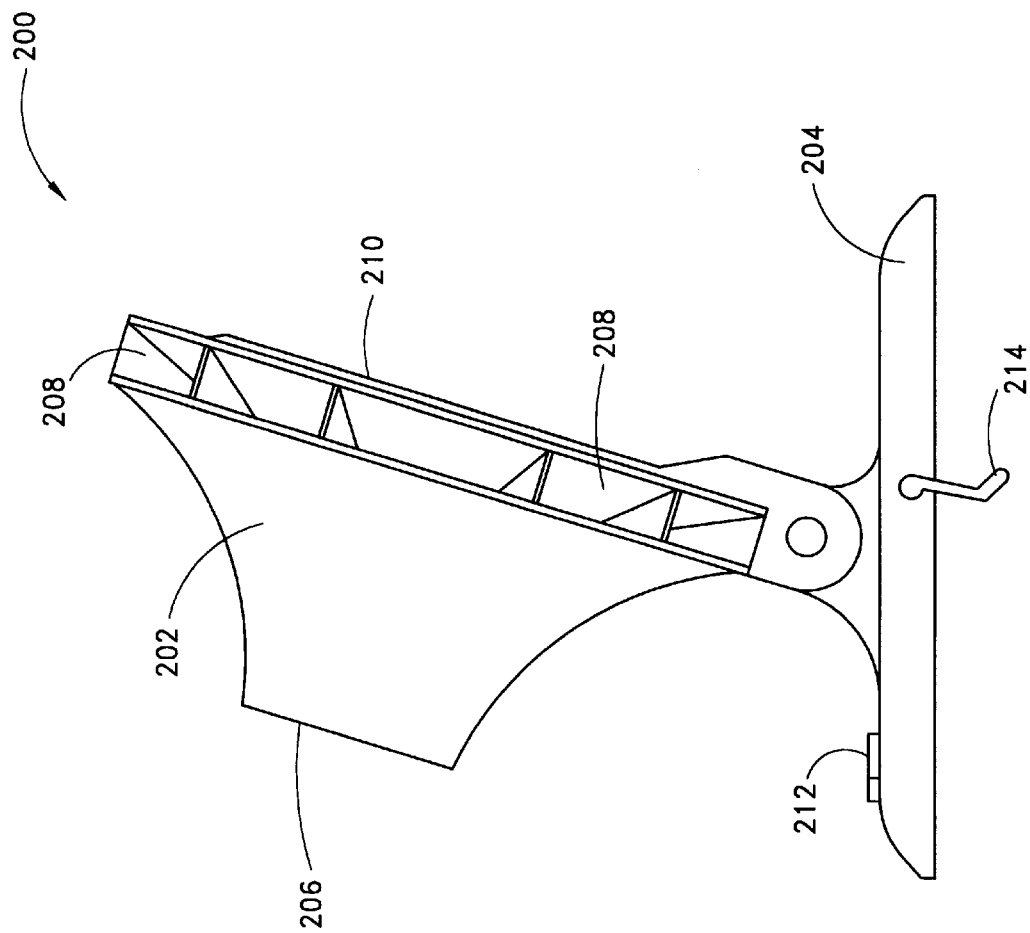
FIG. 10 is a side view of a fan unit incorporating the heat exchanger of the present invention.

With reference to FIG. 10, there is shown a fan unit 200 that is configured to be mounted adjacent or within a standard desk. The fan unit 200 includes a housing 202 that is pivotably mounted to base 204. The housing 202 is substantially cylindrical shaped and includes a conditioned air outlet 206 and one or more waste air outlets 208 around the periphery of the housing 202. An air inlet 210 is located in the housing 200 opposite the conditioned air outlet 206. A control switch 212 and a power cord 214 are coupled to the base 204 for selectively powering the fan unit 200 and/or the thermoelectric element 232 in a well known manner.

Figure 11:
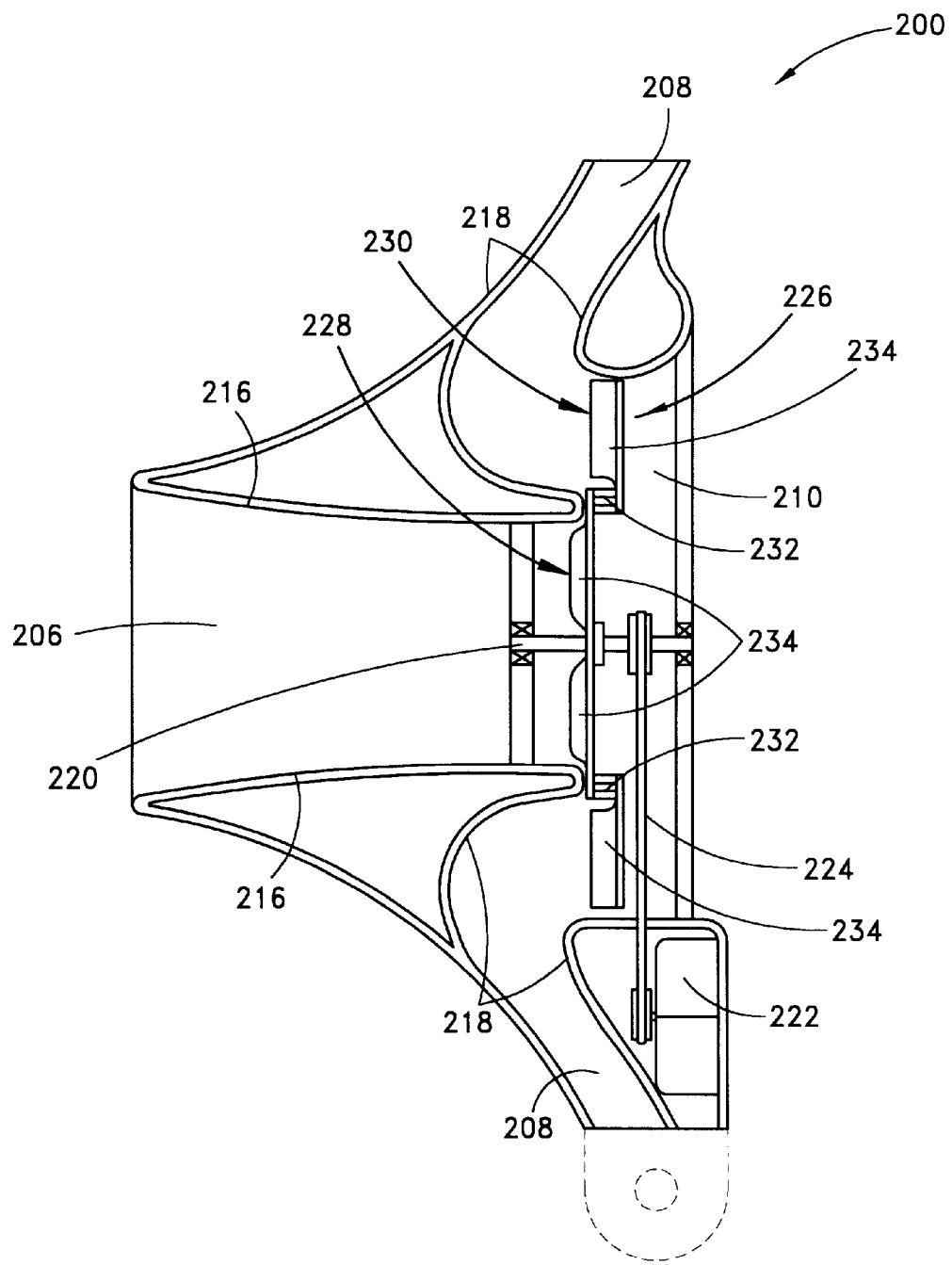
FIG. 11 is a side cross-sectional view of the fan unit of FIG. 10.

FIG. 11 is a cross-sectional view of the fan unit 200. An annular duct 216 is disposed within the housing 202 and defines the conditioned air outlet 206. A second duct 218 defines the waste air outlets 208. A drive axle 220 is rotatably mounted within the housing so as to be axially-aligned with the conditioned air outlet 206. In the illustrated embodiment, a motor 222 is drivingly coupled to the drive axle 220 via a drive belt 224. A rotor assembly 226 is mounted to the drive axle 220 so that the rotor assembly rotates with the drive axle 220.

The rotor assembly 220 comprises a main fan 228 adjacent the conditioned air outlet 206 and an annular waste fan 230 on the side of the main fan 228 opposite the conditioned air outlet 206. A thermoelectric element 232, such as a Peltier heat exchanger, is interposed between the main and waste fans 228 and 230. The main fan 228 has a circumference that is less than or equal to the circumference of the conditioned air outlet 206 so that the main fan is configured to cause air to flow through the conditioned air outlet 206. The waste fan 230 is positioned so to communicate with the waste outlet 208. The main and waste fans 228 and 230 may comprise any type of device that is configured to produce an air flow upon rotation. In one embodiment, the fans comprises flat discs having louvers 234 punched therethrough. The fans are preferably manufactured of a highly thermally conductive material.

In operation, the motor 22 is powered through a power source (not shown) in a well known manner. The thermoelectric device 232 cools the main fan 228 and heats the waste fan 230 (or vice versa) in the manner described above with respect to the previous embodiments. The fans also rotate to produce a flow of conditioned and waste air through the conditioned air outlet 206 and the waste air outlet 208, respectively. The air may be routed to cool a desired location, such as beneath a desk. If desired, ducts, hoses and other devices may be connected to the outlets to further direct the flow of air therefrom.

FIG. 12 shows another embodiment of a heat exchanger comprising a fan unit 170 having a plurality of air flow generating members, such as blades 172, that rotate about an drive axle 174. A motor 176 is drivingly connected to the axle 174, either directly or indirectly, such as through a gear mechanism. One or more electrical heat generating devices, such as electrical resistors 180, are mounted on the blades 172. The resistors may be embedded within the blades 172 or may be painted thereon, such as with adhesive.

In operation, the resistors 180 are heated by applying an electrical current thereto and the axle 174 is rotated via the motor 176. The blades 172 generate an airflow, which is heated by the resistors through a convective process. The fan unit 170 is thereby used to generate a heated airflow.

Given the above disclosure, other variations of this invention will be known to those skilled in the art. For example, the rotors 42, 44 are shown connected to the rotating shaft 52 by plate 51 located adjacent the first or upper wall 31. In this configuration the interior cavity formed by the inner diameters of rotors 42, 44 are interconnected. It is believed possible to have the plate 51 contoured to the exterior shape of the top portion of motor 50 and then extend radially outward at about the plane containing the thermoelectric 46. That would place a physical separation between the air flows entering rotors 42 and 44. It is also believed possible to form the housing of motor 50 with a radial flange extending radially outward at about the plane containing boundary line 56, with the motor 50 rotating, and thus provide a physical separation between the air flows entering the rotor 42 and 44.

The above description refers primarily to the use of the method and apparatus in a vehicle seat. But the method and apparatus are equally applicable to other seats, including, but not limited to, theater seats, office seats, airplane seats, seats found in the home such as sofas and recliners, hospital seats for patients, hospital beds for bedridden patients, and wheelchairs. The method and apparatus is especially useful where a localized flow of conditioned air is desired.

The above description refers to the passage of air through the heat exchangers, but the present invention is not limited to air as other gases may be used with the present apparatus and method. Indeed, some gases, such as helium, have greater thermal conductivity than air and are desirable in certain applications, while other gasses such as oxygen, nitrogen or argon may be more desirable in other applications. A variety of gases and gas mixtures can be used as the particular application requires.

Further, liquids can be used with the present invention by applying appropriate liquid seals and insulators known in the art to keep the liquid circulating through the heat exchanger from making electrical contact with the thermoelectric device and any other electrical devices. Thus, liquids such as water and antifreeze are contemplated for use with the present method and apparatus, as are liquid metals such as liquid sodium. The particular liquid used will depend upon the application. The increased thermal conductivity achieved by passing the liquids over the rotating heat exchanger offer the possibility of increased heat conduction over less dense and less conductive gases. Whether a liquid or gas is most advantageous will vary with the particular application. For ease of reference, the term "fluid" will be used to refer to a gas, a liquid or both.

Because the temperature change available from a thermoelectric can be significant, the rotating heat exchanger of the present invention has potential applicability to a wide variety of uses other than the seat, fan and cooler described herein. The method and apparatus of described herein are generally applicable to any situation where there is a desire to pump a thermally conditioned fluid. Such applications include constant temperature devices, as for example devices using a reference temperature as in a thermocouple assembly. Constant temperature baths for laboratory equipment and experiments is another exemplary application, as for instance growing bacteria cultures or cell cultures. The method and apparatus described herein are particularly useful where lower flow rates and/or smaller temperature changes are desired, but the invention is not so limited and may find application in situations requiring large flow rates and/or substantial temperature differences.

By placing a temperature sensor at a predetermined location, whether on the heat exchanger, the rotating fan, upstream or downstream of the heat exchanger, and electronically controlling the thermoelectric and the fan rotation, a controlled stream of thermally conditioned fluid can be provided to maintain the temperature at a predetermined temperature, or to provide predetermined thermal conditions. Thus, the invention provides advantages where localized thermal control is desired, as in vehicle seats, waterbeds, aquariums, water coolers, and cooling of non-carbonated beverages such as wine and punch. In these applications the temperature is controlled to a fairly constant temperature, or controlled within a fairly narrow temperature range of less than about a 5° F. variation above or below a predetermined temperature, and more typically within a 1–2° F. variation on either side of a predetermined temperature. Such temperature control systems are known to those skilled in the art and their incorporation and use with the present method and apparatus are not described in detail herein.

Further, this device and method find particular application in situations where a fluid of differing temperature is desired at various times. The fan portion of the device may be operated with the thermoelectric heating or cooling aspects being activated only when desired to thermally condition the fluid flowing through the fan. Thus a heated, cooled, or neutral temperature fluid can be provided by the same device and method.

Although the foregoing description of the preferred embodiment of the preferred invention has shown, described, and pointed out certain novel features of the invention, it will be understood that various omissions, substitutions, and changes in the form of the detail of the apparatus as illustrated as well as the uses thereof, may be made by those skilled in the art without departing from the spirit of the present invention. Consequently, the scope of the present invention should not be limited by the foregoing discussion, which is intended to illustrate rather than limit the scope of the invention.

What is claimed is:

1. A temperature controlled ventilation system for a seat, comprising:

a supply side annular heat exchanger forming a hole therein about an axis of rotation and configured to allow air to pass outward from said axis of rotation;

a waste side, annular heat exchanger forming a hole therein about said axis of rotation and configured to allow air to pass outward from said axis of rotation;

a thermoelectric device having opposing surfaces that generate elevated temperatures on one surface and reduced temperatures on the opposing surface depending on the electrical potential applied to the thermoelectric device, one opposing surface being connected to and in thermal communication with the supply side heat exchanger and the other opposing surface being connected to and in thermal communication with the waste side heat exchanger;

a motor drivingly connected to at least one of the heat exchangers or thermoelectric device to rotate the heat exchangers about the axis of rotation to cause air to enter at least one of the holes along the axis of rotation and pass outward through the heat exchanger;

a housing containing at least the supply heat exchanger and forming an outlet through which air exits after passing through the supply heat exchanger;

a seat having a surface against which a person rests, the surface having passages therethrough in at least a portion of the surface where the person rests, the surface being in fluid communication with the outlet of the supply heat exchanger, the heat exchanger and motor rotation cooperating so air from the heat exchanger is forced through the surface to provide conditioned air in the area where said person rests against the surface during use of the seat.

2. A system as defined in claim 1, wherein the housing encloses both heat exchangers and further comprising an insulating layer between the first and second heat exchangers that extends radially outward toward the housing to form an insulated barrier between the supply and waste heat exchangers, and further comprising a non-contacting labyrinth seal formed by a periphery of the insulating layer and a portion of the housing enclosing a periphery of the heat exchangers to inhibit air flow between the heat exchangers.

3. A system as defined in claim 1, additionally comprising a wicking material being connected to at least a portion of the housing and having a first portion in contact with air exiting the supply heat exchanger and having a second portion in contact with air exiting the waste heat exchanger so that if one of the heat exchangers generates moisture the wicking material conducts the moisture away from the heat exchanger producing the moisture.

4. A system as defined in claim 1, wherein the combined height of the heat exchangers and thermoelectric device is less than about 30 mm when measured along the rotational axis.

5. A system as defined in claim 1, wherein the housing encloses both heat exchangers and further comprising an insulating layer between the first and second heat exchangers that extends radially outward toward the housing to form an insulated barrier between the supply and waste heat exchangers.

6. A system as defined in claim 1, with the motor nesting into at least one of said holes in the heat exchangers.

7. A system as defined in claim 6, further comprising a wicking material connected to at least a portion of the housing and having a first portion in contact with air exiting the supply heat exchanger and having a second portion in contact with air exiting the waste heat exchanger so that if one of the heat exchangers generates moisture the wicking material conducts the moisture away from the heat exchanger producing the moisture.

8. A system as defined in claim 7, wherein the housing further encloses the waste side heat exchanger and has a waste side outlet in fluid communication with a passage that exhausts the air from the waste side of the heat exchanger.

9. A system for use with a seat having a surface in fluid communication with a heat exchanger, comprising:
   a first heat exchanger having an outlet in fluid communication with the surface of the seat, the first heat exchanger comprising:
      an electronic element selected to generate heat in response to an electrical current;
      a first heat exchanger connected to and in thermal communication with the electronic element, the heat exchanger comprising a first series of heat exchange surfaces rotatable about a rotational axis and configured to transfer a temperature differential from the electronic element, the electronic element and the heat exchanger being connected to rotate about the rotational axis so that the first series of heat exchange surfaces generates a fluid flow across the heat exchange surfaces; and
      a housing having a fluid outlet located along a periphery of the first heat exchanger and through which the fluid exits the first heat exchanger, the heat exchange surfaces being configured and orientated relative to the housing to intake air along the rotational axis and expel air from the heat exchange surfaces orthogonal to the rotational axis.

10. The system of claim 9, wherein the electronic element comprises a thermoelectric device that has opposing surfaces comprising a first junction on one surface and a second junction on an opposing surface, with the first junction being at a higher temperature than the second junction when electrical current is applied to the thermoelectric element in a first direction, and with the first junction being at a lower temperature than the second junction when the electrical current is applied to the electronic element in a second direction.

11. The system of claim 9, wherein the heat exchanger additionally comprises a second heat exchanger connected to and in thermal communication with the second junction of the thermoelectric element, the second heat exchanger comprising a second series of heat exchange surfaces rotatable about a rotational axis and configured to transfer a temperature differential from the second junction, the second heat exchanger being connected to rotate about the rotational axis with the first heat exchanger so that the second series of heat exchange surfaces generates a fluid flow across the second series of heat exchange surfaces.

12. The system of claim 11, wherein at least one of the first and second series of heat exchange surfaces form substantially flat sheets having longitudinal axes extending outward from the rotational axis and define a series of spaces between the blades.

13. The system of 11, wherein the fluid comprises a gas and at least one of the first and second series of heat exchange surfaces are separated by a distance in the range of approximately 0.5–2 mm.

14. The system of 12, wherein the fluid comprises a gas and at least one of the first and second series of heat exchange surfaces are separated by a distance in the range of approximately 0.5–2 mm.

15. The system of 11, wherein the fluid comprises a gas, the heat exchangers comprise annular heat exchangers and the combined height of the heat exchangers and thermoelectric element is less than about 30 mm measured along the rotational axis.

16. The system of 12, wherein the fluid comprises a gas, the heat exchangers comprise annular heat exchangers and the combined height of the heat exchangers and the thermoelectric element is less than about 30 mm measured along the rotational axis.

17. The system of claim 13, wherein the fluid comprises a gas and at least one of the first and second series of heat exchange surfaces are of thermally conductive material and have a thickness in the range of approximately 0.05–0.2 mm.

18. The system of claim 14, wherein the fluid comprises a gas and at least one of the first and second series of heat exchange surfaces are of thermally conductive material and have a thickness in the range of approximately 0.05–0.2 mm.

19. The system of claim 15, wherein the fluid comprises a gas and at least one of the first and second series of heat exchange surfaces are of thermally conductive material and have a thickness in the range of approximately 0.05–0.2 mm.

20. A system for providing conditioned fluid to a seat, comprising:
    a thermoelectric device selected to convert electrical energy into thermal energy producing a temperature change in response to an electrical current being applied thereto, the thermoelectric device being mounted to rotate about a rotational axis;
    a heat transfer device having an outlet in fluid communication with the seat, the heat transfer device comprising:
        a rotatable flow generating device configured to produce a fluid flow in response to rotation thereof about the axis, the flow generating device further being in conductive thermal communication with the thermoelectric device so that the flow generating device conducts the temperature change generated by the heat transfer device to transfer the temperature change to the fluid flowing across the heat transfer device; and
        a housing having an inlet and further having an outlet on a periphery of the flow generating device, the housing and flow generating device cooperating to intake fluid along the rotational axis and then expel temperature conditioned fluid from the housing in a plane orthogonal to the rotational axis, the flow generating device having a recess into which at least a portion of a motor is placed to rotate the flow generating device.

21. The system of claim 20, wherein the flow generating device comprises a series of radially-extending heat exchange surfaces connected to a first surface of the thermoelectric device.

22. The system of claim 20, wherein the flow generating device comprises a first series of outwardly-extending heat exchange surfaces connected to and in thermal communication with a first surface of the thermoelectric device, and a second series of outwardly-extending heat exchange surfaces connected to an opposing, second surface of the thermoelectric device.

23. A temperature controlled ventilation system for a seat, comprising:

planar means for producing a temperature differential; and annular supply side heat exchanger means for conducting said temperature differential, said heat exchanger means further comprising fluid flow generating means having a height along a rotational axis that is smaller than a length of said heat exchanger means measured along an axis orthogonal to the rotational axis for causing fluid to flow across said heat exchanger means, said supply side heat exchanger means being in fluid communication with the seat.

24. A temperature controlled ventilation system for a seat having a fluid distribution system in fluid communication with the seat, comprising:

a first fan rotating about a rotational axis and having a first plurality of heat exchange elements configured to generate a fluid flow through the heat exchange elements when rotated and in conductive thermal communication with an electronic device that converts electrical energy into a temperature change, the fan being enclosed in a housing that has an outlet in fluid communication with the fluid distribution system, the fan having a height along the longitudinal axis and a diameter along an axis orthogonal to the longitudinal axis with the diameter of the fan being substantially larger than the length to fit within or under a seat.

25. A system as defined in claim 24, wherein the electronic device comprises a thermoelectric device having a first side in thermal communication with said fan, and further comprising a second fan having a second plurality of heat exchange elements in conductive thermal communication with a second side of the thermoelectric device to conduct a temperature differential from said second side of the thermoelectric device, the second fan being enclosed in a housing that has an outlet in fluid communication with an exhaust port.

26. The system of claim 25, wherein at least one of the first and second plurality of heat exchange elements form substantially flat sheets extending radially outward from the rotational axis and define a series of spaces between the blades.

27. The system of claim 25, wherein the fluid comprises a gas and at least one of the first and second plurality of heat exchange elements are separated by a distance in the range of approximately 0.5–2 mm.

28. The system of claim 25, wherein the fluid comprises a gas and the height of the fans and thermoelectric device is less than about 30 mm measured along the rotational axis.

29. The system of claim 25, wherein the fluid comprises a gas and at least one of the first and second plurality of heat exchange elements are of a high thermal conductivity material and have a thickness in the range of approximately 0.05–0.2 mm.

30. A system of claim 25, further comprising a wicking material having a first portion in contact with a gas exiting the first plurality of heat exchange elements and having a second portion in contact with a gas exiting the second plurality of heat exchange elements to conduct any moisture away from the housing in which the moisture is produced.

31. A method for providing temperature controlled ventilation to a seat having a seat surface, comprising the steps of:

forming a supply side heat exchanger rotating about an axis of rotation and configuring the heat exchanger to allow fluid to pass therethrough the supply side heat exchanger having a first height along the rotational axis and a first diameter along an axis orthogonal to the rotational axis with the first height being selected to be less than the first diameter;

forming a waste side heat exchanger rotating about said axis of rotation and configuring the waste side heat exchanger to allow fluid to pass therethrough, the waste side heat exchanger having a second height along the rotational axis and a second diameter along an axis orthogonal to the rotational axis with the second height being selected to be less than the second diameter and sized to fit within or under a seat, and;

providing a thermoelectric device having opposing surfaces that generate elevated temperatures on one surface and reduced temperatures on the opposing surface depending on the electrical potential applied to the thermoelectric device, and conductively connecting one opposing surface of the thermoelectric device to the supply side heat exchanger and conductively connecting the other opposing surface to the waste side heat exchanger;

rotating at the heat exchangers and thermoelectric device about the axis of rotation to cause fluid to pass through the heat exchanger;

enclosing the supply heat exchanger and forming an outlet through which fluid exits after passing through the supply heat exchanger; and placing the seat surface in fluid communication with the outlet of the supply heat exchanger.

32. A method as defined in claim 31, comprising the further step of enclosing both heat exchangers and insulating the first and second heat exchangers from each other and comprising the further step of forming a non-contacting labyrinth seal between a periphery of the insulating layer and a portion of the housing enclosing a periphery of the heat exchangers to inhibit air flow between the heat exchangers.

33. A method for use with a seat having an exterior surface where a person rests, comprising the steps of:

placing a first heat exchanger having a fluid outlet in fluid communication with the exterior surface of the seat and mounting the heat exchanger to rotate about a rotational axis while selecting a height of the first heat exchanger along the rotational axis to be smaller than a length of the first heat exchanger along an axis orthogonal to the rotational axis;

placing the first heat exchanger in conductive thermal communication with an electrical device that is selected to generate a temperature change when an electrical current is applied to the electrical device; and rotating the first heat exchanger about the axis to force fluid through the heat exchanger while conditioning the temperature of the fluid passing over the heat exchanger.

34. The method of claim 33, wherein the step of placing the heat exchanger in thermal communication with an electrical device comprises the step of placing the first heat exchanger in thermal communication with a first surface of a rotating thermoelectric device.

35. The method of claim 34, comprising the further steps of:

placing a second heat exchanger in conductive thermal communication with a second surface of the thermoelectric device while selecting a height of the second heat exchanger along the rotational axis to be smaller than a diameter of the second heat exchanger along an axis orthogonal to the rotational axis and selecting the first and second diameters to be different; and rotating the second heat exchanger about the axis with the first heat exchanger to force fluid through the second heat exchanger while conditioning the fluid passing through the second heat exchanger.

36. The method of claim 35, comprising the further step of forming at least one of the first and second heat exchangers to have a series of heat exchange elements formed of substantially flat sheets extending radially outward from the rotational axis and define a series of spaces between the blades.

37. The method of claim 36, comprising the further step of separating said series of heat exchange elements by a distance in the range of approximately 0.5–2 mm.

38. The method of claim 35, comprising the further step of forming the first and second series of heat exchange elements and the thermoelectric device to have an annular shape and a combined height that is less than about 30 mm measured along the rotational axis.

39. The method of claim 35, comprising the further step of forming the series of heat exchange elements of a thermally conductive material with a thickness in the range of approximately 0.05–0.2 mm.

40. The method of claim 35, comprising the further step of placing the heat exchangers inside the seat.

41. A method for providing temperature controlled ventilation to an seat having an fluid distribution system in fluid communication with the seat, comprising the steps of:

generating a temperature differential by an electronic device that is selected to convert electrical energy into a temperature change;

placing a first plurality of heat exchange surfaces of a first fan in conductive thermal communication with the electronic device to conduct the temperature differential through the heat exchange surfaces;

rotating the first fan about a rotational axis to cause the fluid to pass over the heat exchange surfaces to condition the fluid;

enclosing the fan in a housing that has an outlet, the first fan and housing being selected to have a height along the rotational axis smaller than a diameter along an axis orthogonal to the rotational axis with the height and diameter selected so the first fan can fit within a seat; and placing the outlet in fluid communication with the fluid distribution system.

42. A method defined in claim 41, wherein the electronic device comprises a thermoelectric device having a first side in thermal communication with said fan, and further comprising the steps of providing a second fan having a second plurality of heat exchange surfaces placed in conductive thermal communication with a second side of the thermoelectric device to conduct a temperature differential from said second side of the thermoelectric device, and rotating the second fan with the first fan, and enclosing the second fan in a housing that has an outlet in fluid communication with an exhaust port, the second fan and its housing being selected to have a second height along the rotational axis smaller than a second diameter along an axis orthogonal to the rotational axis with the second height and second diameter selected so the second fan can fit within a seat, and wherein the first and second housings are configured so the fluid enters the fans along the rotational axis.

43. An apparatus for thermally conditioning a fluid, comprising:

a thermoelectric device selected to convert electrical energy into thermal energy producing a temperature change in response to an electrical current being applied thereto, the thermoelectric device comprising a circular disk having first and second opposing surfaces and being mounted to rotate about a rotational axis through a center of the disk;

an annular heat transfer device having an inner diameter and an outer diameter and placed in conductive thermal communication with the electronic device and being mounted on one of the disk surfaces to rotate about the axis, the heat transfer device having thermally radiating surfaces arranged to produce a fluid flow across the surfaces outward from the rotational axis when rotated about the axis, the heat transfer device having a height measured along the rotational axis and the diameters measured along an axis orthogonal to the rotational axis with the distance between the inner and outer diameters being greater than the height.

44. The system of claim 43, wherein the electronic device comprises a thermoelectric device.

45. The apparatus of claim 43, wherein the heat transfer device comprises a first series of outwardly-extending thermally radiating surfaces connected to a first surface of the electric device.

46. The apparatus of claim 44, wherein the heat transfer device comprises a first series of thermally radiating surfaces connected to the first surface of the thermoelectric device and wherein the first series of radiating surfaces are aligned with a plurality of axes orthogonal to the rotational axis, and a second series of thermally radiating surfaces connected to the second surface of the thermoelectric device and wherein the series of second radiating surfaces are aligned with a plurality of axes orthogonal to the rotational axis, the first and second series of thermally radiating surfaces having different radiative areas.

47. The apparatus of claim 46, wherein the heat transfer device is contained in a housing having at least one outlet in fluid communication with a seat and having an inlet configured to provide the fluid to the inner diameter of the annular thermally radiating surfaces along the rotational axis.

48. A temperature conditioning fluid moving device, comprising:

a first fan rotating about a rotational axis and having a first plurality of heat exchange surfaces in conductive thermal communication with a thermoelectric device that converts electrical energy into a temperature change, the fan being enclosed in a housing that has an outlet, the electronic device comprises a thermoelectric device having a first side in thermal communication with said fan, and further comprising a second fan rotating about the rotational axis and having a second plurality of heat exchange surfaces in conductive thermal communication with a second side of the thermoelectric device to conduct a temperature change from said second side of the thermoelectric device, the second fan being enclosed in a housing that has an outlet, the first and second fans comprising annular structures with differing outer diameters such that the first fan extends from the thermoelectric device toward the rotational axis while the second fan extends from the thermoelectric device away from the fan, each of the fans having a height along the rotational axis that is smaller than the diameter measured orthogonal to the rotational axis.

49. A device as defined in claim 48, wherein at least one of the outlets is in fluid communication with a seat.

50. A device as defined in claim 48, wherein at least some of the heat exchange surfaces form substantially flat sheets extending outward from the rotational axis and define a series of spaces between the sheets.

51. A device as defined in claim 48, wherein the at least one of the first and second series of heat exchange surfaces are separated by a distance in the range of approximately 0.5–2 mm.

52. A device as defined in claim 48, wherein the fans have an annular shape and the height of the fans and thermoelectric device is less than about 30 mm measured along the rotational axis.

53. A device as defined in claim 48, wherein at least one of the first and second plurality of heat exchange surfaces are of a thermally conductive material and have a thickness in the range of approximately 0.05–0.2 mm.

54. A method for thermally conditioning a fluid, comprising the steps of:
forming a supply side heat exchanger rotating about an axis of rotation and configuring that heat exchanger to allow gas to pass therethrough, the supply side heat exchanger having a first height along the axis of rotation and having a diameter orthogonal to that axis with the diameter being selected to be greater than the height;
forming a waste side heat exchanger rotating about said axis of rotation and configuring the waste side heat exchanger to allow gas to pass through, the waste side heat exchanger having a second height along the axis of rotation and having a second diameter orthogonal to the rotational axis with the second diameter being selected to be greater than the second height;
providing a thermoelectric device having opposing surfaces that generate elevated temperatures on one surface and reduced temperatures on the opposing surface depending on the electrical potential applied to the thermoelectric device, and conductively connecting one opposing surface of the thermoelectric device to the supply side heat exchanger and conductively connecting the other opposing surface to the waste side heat exchanger;
rotating the heat exchangers and thermoelectric device about the axis of rotation to cause gas to pass through the heat exchangers;
enclosing the supply heat exchanger and forming an outlet through which gas exits after passing through the supply heat exchanger; and
placing the outlet from the supply side heat exchanger in fluid communication with the interior of an enclosed and insulated portable chamber, while exhausting the gas from the waste side heat exchanger outside the chamber.

55. A method as defined in claim 54 wherein the step of forming the supply side heat exchanger comprises forming the heat exchanger with a hole therein about said axis of rotation and configuring that heat exchanger to allow gas to pass outward from said axis of rotation;
and wherein said step of forming a waste side heat exchanger comprises the step of forming a hole therein about said axis of rotation and configuring the waste side heat exchanger to allow gas to pass outward from said axis of rotation; and
wherein said step of rotating the heat exchangers and thermoelectric device about the axis of rotation causes fluid to enter at least one of the holes and pass outward through the heat exchanger.

56. A method as defined in claim 54, comprising the further steps of:
placing a seat in fluid communication with the outlet of the supply side heat exchanger.

57. A method as defined in claim 54, comprising the further step of providing a closable opening to allow access to the interior of the chamber.

58. A temperature controlled ventilation system for a seat, comprising:
a supply side heat exchanger forming a hole therein about an axis of rotation and configured to allow air to pass outward from said axis of rotation;
a waste side heat exchanger forming a hole therein about said axis of rotation and configured to allow air to pass outward from said axis of rotation;
a thermoelectric device having opposing surfaces that generate elevated temperatures on one surface and reduced temperatures on the opposing surface depending on the electrical potential applied to the thermoelectric device, one opposing surface being connected to and in thermal communication with the supply side heat exchanger and the other opposing surface being connected to and in thermal communication with the waste side heat exchanger;
a motor drivingly connected to at least one of the heat exchangers or thermoelectric device to rotate the heat exchangers about the axis of rotation to cause air to enter at least one of the holes and pass outward through the heat exchanger;
a housing containing at least the supply heat exchanger and forming an outlet through which air exits after passing through the supply heat exchanger;
a seat of a motor vehicle having a surface against which a person rests, the surface having passages therethrough in at least a portion of the surface where the person rests, the surface being in fluid communication with the outlet of the supply heat exchanger, the heat exchanger and motor rotation cooperating so air from the heat exchanger is forced through the surface to provide conditioned air in the area where the passenger rests against the surface; and
a wicking material being connected to at least a portion of the housing and having a first portion in contact with air exiting the supply heat exchanger and having a second portion in contact with air exiting the waste heat exchanger so that if one of the heat exchangers generates moisture the wicking material conducts the moisture away from the heat exchanger producing the moisture.

59. A temperature controlled ventilation system for a seat having a fluid distribution system in fluid communication with the seat, comprising:
a first fan rotating about a rotational axis and having a first plurality of heat exchange elements configured to generate a fluid flow through the heat exchange elements when rotated and in conductive thermal communication with an electronic device that converts electrical energy into a temperature change, the fan being enclosed in a housing that has an outlet in fluid communication with the fluid distribution system, wherein the electronic device comprises a thermoelectric device having a first side in thermal communication with said fan, and further comprising a second fan having a second plurality of heat exchange elements in conductive thermal communication with a second side of the thermoelectric device to conduct a temperature differential from said second side of the thermoelectric device, the second fan being enclosed in a housing that has an outlet in fluid communication with an exhaust port, and a wicking material having a first portion in contact with a gas exiting the first plurality of heat exchange elements and having a second portion in contact with a gas exiting the second plurality of heat exchange elements to conduct any moisture away from the housing in which the moisture is produced.

60. A method for use with a seat having an exterior surface where a person rests, comprising the steps of:

placing a first heat exchanger having a fluid outlet in fluid communication with the exterior surface of the seat and mounting the heat exchanger to rotate about a rotational axis;

placing the first heat exchanger in conductive thermal communication with an electrical device that is selected to generate a temperature change when an electrical current is applied to the electrical device, by placing the first heat exchanger in thermal communication with a first surface of a rotating thermoelectric device;

rotating the first heat exchanger about the axis to force fluid through the heat exchanger while conditioning the temperature of the fluid passing over the heat exchanger;

placing a second heat exchanger in conductive thermal communication with a second surface of the thermoelectric device;

placing the heat exchangers inside the seat; and rotating the second heat exchanger about the axis with the first heat exchanger to force fluid through the second heat exchanger while conditioning the fluid passing through the second heat exchanger.

* * * * *